(12) United States Patent
Kim et al.

(10) Patent No.: US 11,687,407 B2
(45) Date of Patent: Jun. 27, 2023

(54) SHARED ERROR CORRECTION CODE (ECC) CIRCUITRY

(71) Applicant: Micron Technology, Inc., Boise, ID (US)

(72) Inventors: Kang-Yong Kim, Boise, ID (US); Hyun Yoo Lee, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 17/412,050

(22) Filed: Aug. 25, 2021

(65) Prior Publication Data

US 2022/0066874 A1     Mar. 3, 2022

Related U.S. Application Data

(60) Provisional application No. 63/126,443, filed on Dec. 16, 2020, provisional application No. 63/071,300, filed on Aug. 27, 2020.

(51) Int. Cl.
| | | |
|---|---|---|
| G11C 11/00 | (2006.01) | |
| G06F 11/10 | (2006.01) | |
| G11C 11/409 | (2006.01) | |

(52) U.S. Cl.
CPC ........ *G06F 11/1068* (2013.01); *G11C 11/409* (2013.01)

(58) Field of Classification Search
CPC ............................ G06F 11/1068; G11C 11/409
See application file for complete search history.

(56) References Cited

U.S. PATENT DOCUMENTS

| | | | | |
|---|---|---|---|---|
| 8,898,543 | B2 * | 11/2014 | Jo ..................... | H03M 13/6306 |
| | | | | 714/764 |
| 8,942,028 | B1 * | 1/2015 | Hu ..................... | G11C 13/0069 |
| | | | | 365/185.24 |

(Continued)

FOREIGN PATENT DOCUMENTS

| | | |
|---|---|---|
| KR | 20050064887 | 6/2005 |
| KR | 20180003468 | 1/2018 |
| WO | 2022047266 | 3/2022 |

OTHER PUBLICATIONS

"International Search Report and Written Opinion", Application No. PCT/US2021/047766, dated Dec. 1, 2021, 11 pages.

(Continued)

*Primary Examiner* — Esaw T Abraham
(74) *Attorney, Agent, or Firm* — Colby Nipper PLLC

(57) ABSTRACT

Described apparatuses and methods provide error correction code (ECC) circuitry that is shared between two or more memory banks of a memory, such as a low-power dynamic random-access memory (DRAM). A memory device may include one or more dies, and a die can have multiple memory banks. The ECC circuitry can service at least two memory banks by producing ECC values based on respective data stored in the two memory banks. By sharing the ECC circuitry, instead of including a per-bank ECC engine, a total die area allocated to ECC functionality can be reduced. Thus, the ECC circuitry can be elevated from a one-bit ECC algorithm to a multibit ECC algorithm, which may increase data reliability. In some cases, memory architecture may operate in environments in which a masked-write command or an internal read-modify-write operation is precluded, including with shared ECC circuitry.

39 Claims, 11 Drawing Sheets

(56) References Cited

U.S. PATENT DOCUMENTS

| | | | |
|---|---|---|---|
| 11,170,868 B2* | 11/2021 | Ryu | G11C 7/1057 |
| 11,301,317 B2* | 4/2022 | Kim | G06F 11/076 |
| 11,314,589 B2* | 4/2022 | Bains | G06F 11/1072 |
| 11,327,838 B2* | 5/2022 | Park | G06F 11/1076 |
| 11,416,335 B2* | 8/2022 | Cho | H01L 25/0657 |
| 2008/0046796 A1 | 2/2008 | Dell et al. | |
| 2009/0049364 A1 | 2/2009 | Jo et al. | |
| 2011/0040924 A1* | 2/2011 | Selinger | G06F 11/1004 |
| | | | 711/E12.008 |
| 2012/0060066 A1 | 3/2012 | Nagadomi | |
| 2013/0159812 A1 | 6/2013 | Loh et al. | |
| 2014/0164874 A1 | 6/2014 | Franceschini et al. | |
| 2015/0212885 A1 | 7/2015 | Coteus et al. | |
| 2016/0004596 A1* | 1/2016 | D'Abreu | G06F 11/108 |
| | | | 714/773 |
| 2017/0322843 A1* | 11/2017 | Hsu | G06F 3/0688 |
| 2018/0210787 A1* | 7/2018 | Bains | G11C 11/409 |
| 2019/0140668 A1* | 5/2019 | Kim | G06F 11/1068 |
| 2020/0104205 A1 | 4/2020 | Noguchi et al. | |
| 2020/0135291 A1 | 4/2020 | Takahashi et al. | |
| 2022/0066655 A1 | 3/2022 | Lee et al. | |

OTHER PUBLICATIONS

"International Search Report and Written Opinion", Application No. PCT/US2021/048112, dated Dec. 23, 2021, 10 pages.

"International Preliminary Report on Patentability", Application No. PCT/US2021/047766, dated Feb. 28, 2023, 7 pages.

"International Preliminary Report on Patentability", Application No. PCT/US2021/048112, dated Feb. 28, 2023, 7 pages.

* cited by examiner

SHARED ERROR CORRECTION CODE (ECC) CIRCUITRY

CROSS-REFERENCE TO RELATED APPLICATION(S)

This application claims the benefit of U.S. Provisional Application No. 63/126,443, filed 16 Dec. 2020, and the benefit of U.S. Provisional Application No. 63/071,300, filed 27 Aug. 2020, the disclosures of which are hereby incorporated by reference in their entireties herein.

BACKGROUND

Computers, smartphones, and other electronic devices operate using processors and memories. A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from accessing memories more quickly. Applications may also operate on ever-larger data sets that use ever-larger memories. Due to battery-powered electronic devices and power-hungry data centers, energy-usage constraints are becoming more prevalent for memory systems. Further, manufacturers may seek physically smaller memories as the form factors of portable electronic devices continue to shrink. Accommodating these various demands is thus complicated by the diverse strengths and capabilities of different types of memories.

BRIEF DESCRIPTION OF THE DRAWINGS

Apparatuses of and techniques for shared error correction code (ECC) circuitry are described with reference to the following drawings. The same numbers are used throughout the drawings to reference like features and components.

DETAILED DESCRIPTION

Overview

Figure 1:
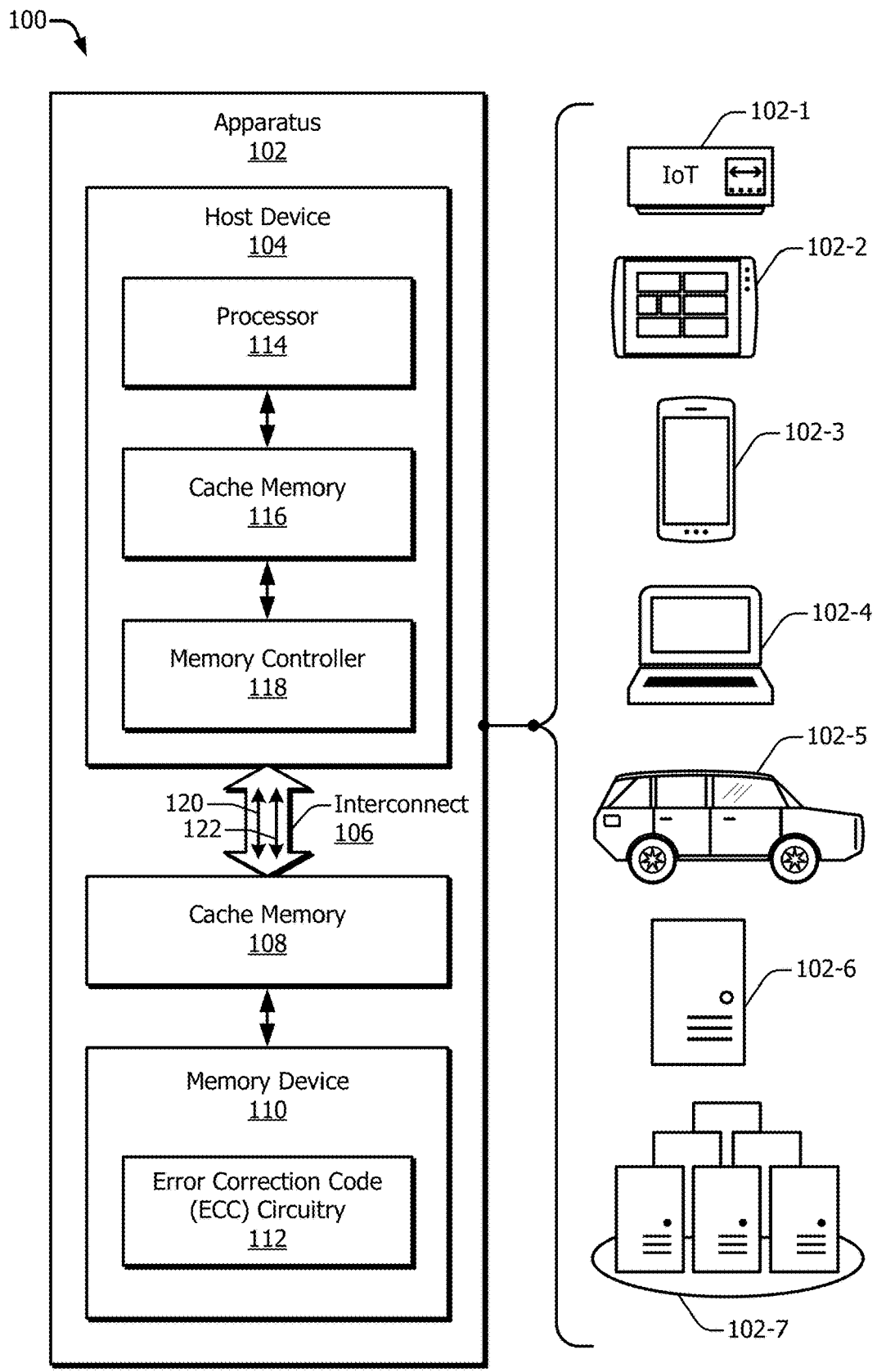
FIG. 1 illustrates example apparatuses that can implement shared ECC circuitry.

Processors and memory work in tandem to provide features to users of computers and other electronic devices. Generally, an electronic device can provide enhanced features, such as high-resolution graphics and artificial intelligence, as a processor and memory tandem operate faster. For decades, advances in processors have often outpaced those in memory technologies. Memory can therefore cause a bottleneck during program execution due to the disparity in speed between processors and memories.

To counterbalance the intrinsic faster operational speed of some processors, computer engineers have developed several techniques to increase memory performance. One such technique involves accessing multiple memories in parallel. To enable parallel accessing of a memory, a memory device is designed and constructed to have multiple memory banks. Each memory bank can be accessed at least partially in parallel with one or more other memory banks, which can multiply a rate of data accessing provided by the banked memory. For example, if each memory bank of a four-banked memory device can read a byte of data substantially simultaneously, then the four-banked memory device may produce four bytes of data in a time period that a non-banked memory produces only one byte of data.

To enable each memory bank of multiple memory banks to read data (e.g., extract a byte of information from memory cells) simultaneously, each memory bank can be associated with access circuitry that can operate separately, at least in part, from the access circuitry of other memory banks. A consequence of this parallel accessing may therefore involve replicating access circuitry for each memory bank of a memory device that is divided into multiple memory banks. Memory devices thus evolved to replicate some access circuitry for each memory bank and to co-locate the replicated access circuitry proximately to each memory bank. This evolution has resulted in constraints in the area of memory protection, specifically memory safety and reliability like error correction using error correction code (ECC) technology. This evolution with ECC technology is described further below after some example memory types are introduced.

There are multiple types of dynamic random-access memory (DRAM). Low-power double data rate (DDR) memory, which is sometimes referred to as LPDDR or mobile DDR, is a DDR synchronous DRAM (DDR SDRAM) that can use less power than some other types of DDR SDRAM. In some applications, LPDDR memory may also operate at higher data rates than other types of DDR SDRAM. Device manufacturers often use LPDDR memory in mobile devices, such as cellular phones and tablet computers, to extend battery life. Increasingly, cloud and web services companies use LPDDR memory in server applications to reduce electricity usage and therefore lower operational costs across large data centers. Designing LPDDR for different use cases and applications, however, is challenging.

LPDDR memory may include 1-bit error-correction logic, which is based on error correction code (ECC) techniques. Using ECC technology can reduce the effects of data corruption and may improve memory and system performance. LPDDR memory may also be constructed with different data array topologies for different applications. The ability to manage performance of an LPDDR memory by choosing from among different topologies based on the application for which the LPDDR memory is destined is an important aspect of memory design. Careful memory design can, for instance, produce memory that is more power-efficient or more area-efficient. Other design considerations may include the size and shape of the LPDDR memory. Some features supported by an LPDDR architecture can restrict design flexibility by, for example, limiting the data array topologies that can be used, occupying additional die space, or requiring additional components or logic, such as additional or redundant ECC logic.

Nonetheless, on-die mechanisms to increase reliability for double data rate synchronous dynamic random-access memory (DDR SDRAM), including low-power DDR (LPDDR) SDRAM, can be improved by implementing error-correction logic. Error-correction logic can be implemented by employing ECC mechanisms with an ECC engine that determines ECC values on data portions (e.g., some quantity of bytes). As mobile devices become more powerful to handle computing, graphics, artificial intelligence (AI), and other processing operations, improvements in memory reliability become more important to users and both hardware and application designers. Some stronger forms of error correction, such as a 2-bit or a 3-bit ECC algorithm (e.g., as implemented by an ECC2 or an ECC3 engine), can increase on-die reliability coverage for an LPDDR memory. This document describes techniques to enable such stronger ECC data protections. For example, an ECC engine can be shared among multiple banks of an LPDDR memory with multiple different ways on a same die.

Multi-banked memory evolved to have some amount of dedicated access circuitry per memory bank that is positioned proximate to each memory bank. Such dedicated access circuitry may include sense amps, pre-charge circuits, column address circuitry, buffers or routing circuitry, and ECC circuitry. In some approaches, a respective ECC engine is included in the ECC circuitry for each respective memory bank. With some chip layouts, one ECC "block" or contiguous die region may be disposed between two memory banks. This one ECC block, however, includes two ECC engines—one ECC engine per memory bank. With these approaches, an ECC engine is thus present for each memory bank. Because of the quantity of ECC engines included on a memory die with this approach, each ECC engine is implemented using 1-bit ECC technology to conserve die area. Compared to a 1-bit ECC engine, a 2-bit ECC engine can occupy three to four times (3-4×) more area. This area discrepancy can increase even faster for ECC engines with three or more bits. It may therefore be impractical to provide an ECC engine that uses more than one bit if the ECC engine is replicated on a per-memory-bank basis.

To at least partially address these issues, this document describes other approaches in which ECC circuitry is shared across multiple memory blocks. Thus, the ECC circuitry can provide ECC functionality to two or more memory blocks of the multiple memory blocks of a memory array. For example, an ECC engine of the ECC circuitry can perform ECC determinations (e.g., computations) for data stored in multiple memory banks, such as a first memory bank and a second memory bank. In operation, the ECC engine determines a first ECC value based on first data that is stored in a first memory bank, and the ECC engine also determines a second ECC value based on second data that is stored in a second memory bank. This avoids at least some replication of ECC circuitry. By omitting instances of ECC engines, ECC technology that uses more than one bit can be employed in a memory device. With multibit ECC circuitry, higher levels of error detection or correction can be implemented to provide greater data reliability as compared to per-memory-bank ECC approaches.

In some cases, however, the architecture, protocols, or features of DDR memory can adversely impact performance improvements that might be achieved more feasibly using a carefully designed ECC mechanism. For example, a masked-write command is a command that can be used to write a group of bits (e.g., 64 bits) while masking some of the bits (e.g., 8 bits), which may be called the "masked bits." The masked bits, therefore, retain their previous value instead of being overwritten. The masked data may be treated as a single group of bits using an internal read-modify-write operation to ensure that the masked bits in the group of bits are not overwritten.

The internal read-modify-write operation can be considered an "atomic" operation formed from three operations. These three operations may include reading existing data at a location that is to be mask-written and modifying the write data for the write command in light of the mask and the data that has been read. As part of the reading or modifying operation, the memory may use ECC circuitry to detect or correct errors in the data being masked and therefore retained as part of the masked-write command. Placing an ECC engine near each memory bank can mitigate propagation delays for the data portion undergoing ECC processing. After the modifying, the internal read-modify-write operation writes the modified group of bits such that the masked data is unchanged. The atomic read-modify-write operation may also entail a second ECC determination for the modified group of bits.

Performing these multiple access operations can cause timing constraints in the memory system because the internal read-modify-write operation to implement a masked-write command can take longer than implementing a standard or non-masked write command. Further, additional control circuitry is employed to perform the relatively complex read-modify-write operation. Because of the timing constraints and the additional control circuitry, implementing the masked-write feature can lead to incorporating at least one ECC engine for each memory bank of a die in an LPDDR memory. These replicated ECC engines consume valuable die space. Moreover, the data array topology of the LPDDR memory may be constrained because of the bits that are grouped when implementing a masked-write command and because of the additional control circuitry.

In contrast, consider the following discussion of techniques for taking advantage of the benefits of a DRAM architecture with multibit ECC circuitry, which may be implemented as part of an LPDDR architecture or protocol, including a post-LPDDR5 architecture or protocol. A memory device, such as SDRAM, can be fabricated on a die and formed from blocks or arrays of memory cell locations that are arranged into rows and columns. Control circuitry for accessing the memory cell locations may be disposed "above" a column or otherwise outside of a memory array of the memory cells. Yet, for a given die size, there is a finite or limited amount of area, relative to the memory array, that can be devoted to the memory access control circuitry.

As indicated above, the portion of the memory access control circuitry that is reserved for performing masked-write operations can be relatively substantial. This can reduce the amount of area available to other potential control circuitry, or additional memory capacity, that could improve operation of the memory device. For example, it can be difficult to add ECC control circuitry that interacts with multiple different memory banks due to chip layout limitations, which are exacerbated by enabling masked-write operations. Instead, for a given approach, a separate ECC engine is built for each memory bank of the memory device because some wires that extend among various different banks can then be obviated. This approach, however, has two drawbacks. First, a one-bit ECC engine is replicated in multiple locations, which wastes the limited chip die area. Second, because the ECC engine is being replicated, it is infeasible from a cost or area perspective to utilize more-complex ECC engines, such as 2-bit or 3-bit ECC engines.

Accordingly, this document describes approaches for making multibit ECC mechanisms feasible within a given die size. For at least some applications and use cases, the masked-write command described above is used only rarely. By omitting the masked-write command from a suite of available memory access operations, the associated (and relatively large) control circuitry is obviated and can therefore be omitted. Further, the effect or functionality of the masked-write operation can still be achieved by a host sending the memory device a couple of separate memory access commands. By precluding the masked-write command and thus being able to omit the corresponding control circuitry from a memory device, a portion of the finite control area becomes available for other uses.

That additional area can be used, for example, for wiring that extends from multiple memory banks to a shared (e.g., common or joint) ECC engine. Because the shared ECC engine does not need to be replicated across the die at each memory bank of multiple memory banks, it can be feasible to implement a multibit ECC engine. Such a multibit ECC engine can provide higher-order reliability as compared to a single-bit ECC engine. Memory devices can therefore be "upgraded" from using single-bit ECC technology to using multibit ECC technology without appreciably increasing the die size or cost and without reducing or removing core memory-access functionality. Further, data propagation delays between a memory bank and a shared (e.g., centralized) ECC engine that might adversely impact a multipart read-modify-write operation are rendered irrelevant if a masked-write command is precluded by the architecture or protocols of a memory device.

Thus, if masked-write commands and the corresponding internal read-modify-write operations are omitted or unsupported, the associated timing constraints or control complexity can be reduced or eliminated. LPDDR and other memory designers can therefore more feasibly implement a multibit ECC engine that is shared across multiple banks in a memory device. Using the shared multibit ECC engine can provide better error correction, which can provide increased reliability and data accuracy, relative to single-bit ECC mechanisms. Further, shared multibit ECC circuitry may occupy less die space than approaches that include multiple 1-bit ECC engines (e.g., one for each memory bank), even though a single multibit ECC engine may consume more die space than a single 1-bit ECC engine. Additionally, without the data-grouping obligations associated with enabling masked-write commands and the corresponding internal read-modify-write operations, a wider range of data array topologies are available. Employing a data array topology that is suitable to a given application or use case can lead to improved memory performance (e.g., different memory mappings may be available with different topologies). Data array topology, in combination with the workload and application, can affect data failure rates. Thus, flexibility in selecting a data array topology may improve data failure rates, memory capacity per die, and/or manufacturing yields.

This document therefore describes memory device approaches in which ECC circuitry is shared across two or more of multiple memory banks. For example, a single ECC engine may service two or more, including up to all, memory banks on a given memory die. By omitting per-memory-bank dedicated ECC engines, and by instead using at least one shared ECC engine, the die area that is allocated for ECC functionality can be reduced. Accordingly, ECC processing can be increased from a one-bit ECC algorithm to a multibit ECC algorithm, which can increase data reliability. Further, a memory device may preclude masked-write functionality to accelerate memory accessing, even with shared ECC circuitry. The preclusion can entail selective enablement or disablement of masked-write commands. On the other hand, if the preclusion of masked-write functionality involves omitting a capability to perform an internal read-modify-write operation, the corresponding control circuitry—and both the associated area and layout complexities—can be reduced, if not eliminated.

Moreover, the sharing of ECC circuitry across multiple memory banks can be combined with the preclusion of masked-write commands. By combining these aspects, an additional memory-accessing delay for processing masked-write commands that might otherwise be introduced by sharing ECC circuitry can be obviated. In these manners, the sharing of ECC circuitry in a memory device can increase data reliability, can decrease die area that is devoted to ECC functionality, can increase chip layout topology flexibility, and/or provide other features and benefits that are described herein.

Example Operating Environments

FIG. 1 illustrates, at 100 generally, example apparatuses 102 that can implement shared error correction code (ECC) circuitry. The apparatus 102 can be realized as, for example, at least one electronic device. Example electronic-device implementations include an internet-of-things (IoTs) device 102-1, a tablet device 102-2, a smartphone 102-3, a notebook computer 102-4 (or desktop computer), a passenger vehicle 102-5, a server computer 102-6, a server cluster 102-7 that may be part of cloud computing infrastructure or a data center, and a portion thereof (e.g., a printed circuit board (PCB)). Other examples of the apparatus 102 include a wearable device, such as a smartwatch or intelligent glasses; an entertainment device, such as a set-top box or video dongle, a smart television, or a gaming device; a motherboard or server blade; a consumer appliance; a vehicle or drone, or the electronic components thereof; industrial equipment; a security or other sensor device; and so forth. Each type of electronic device or other apparatus can include one or more components to provide some computing functionality or feature.

In example implementations, the apparatus 102 can include at least one host device 104, at least one interconnect 106, at least one cache memory 108, and at least one memory device 110. The host device 104 can include at least one processor 114, at least one cache memory 116, and at least one memory controller 118. The memory device 110 may be realized, for example, with a dynamic random-access memory (DRAM) die or module, including with a three-dimensional (3D) stacked DRAM device, such as a high bandwidth memory (HBM) device or a hybrid memory cube (HMC) device. The memory device 110 may operate as a main memory. Although not shown, the apparatus 102 can also include storage memory. The storage memory may be realized, for example, with a storage-class memory device, such as one employing 3D XPoint™ or phase-change memory (PCM), a hard disk or solid-state drive, or flash memory.

Regarding the host device 104, the processor 114 is coupled to the cache memory 116, and the cache memory 116 is coupled to the memory controller 118. The processor 114 is also coupled, directly or indirectly, to the memory controller 118. The host device 104 may include other components to form, for instance, a system-on-a-chip (SoC). The processor 114 may include or comprise a general-purpose processor, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), an SoC, and so forth. In operation, the memory controller 118 can provide a high-level or logical interface between the processor 114 and at least one memory (e.g., a memory that is external to the host device 104). The memory controller 118 can, for example, receive memory requests from the processor 114 and provide the memory requests to an external memory with appropriate formatting, timing, reordering, and so forth. The memory controller 118 can also forward to the processor 114 responses to the memory requests that the memory controller 118 receives from the external memory.

Regarding connections that are external to the host device 104, the host device 104 is coupled to the cache memory 108 via the interconnect 106. The cache memory 108 is coupled to the memory device 110, and the memory device 110 may be coupled to a storage memory (not shown). The host device 104 can also be coupled, directly or indirectly, to the memory device 110 and the storage memory via the interconnect 106. The depicted interconnect 106, as well as other interconnects (not shown) that communicatively couple together various components, enable data to be transferred between two or more components of the various components. Interconnect examples include a bus, a switching fabric, one or more wires that carry voltage or current signals, and so forth. The interconnect 106 can include at least one command and address bus 120 (CA bus 120) and at least one data bus 122 (DQ bus 122). Each bus may be implemented as a unidirectional bus or a bidirectional bus. The interconnect 106 may also include a clock bus (CK bus—not shown) that is part of or separate from the command and address bus 120. The CA and DQ buses 120 and 122 may be coupled to CA and DQ pins, respectively, of the memory device 110. In some implementations, the interconnect 106 may also include a chip-select (CS) I/O (not shown) that can, for example, be coupled to one or more CS pins of the memory device 110.

The depicted components of the apparatus 102 represent an example computing architecture with a hierarchical memory system. A hierarchical memory system may include memories at different levels, with each level having a memory with a different speed or capacity. As shown, the cache memory 116 is logically coupled between the processor 114 and the cache memory 108. The cache memories 116 and 108 are logically coupled between the processor 114 and the memory device 110. Here, the cache memory 116 is at a higher level of the hierarchical memory system than is the cache memory 108. Similarly, the cache memory 108 is at a higher level of the hierarchical memory system than is the memory device 110. A storage memory, in turn, can be deployed at a lower level than the main memory as represented by the memory device 110. At lower hierarchical levels, memories may have decreased speeds but increased capacities relative to memories at higher hierarchical levels.

Although various implementations of the apparatus 102 are depicted in FIG. 1 and described herein, an apparatus 102 can be implemented in alternative manners. For example, the host device 104 may include multiple cache memories, including multiple levels of cache memory, or may have no cache memory. In some cases, the host device 104 may omit the processor 114 or the memory controller 118. A memory, such as the memory device 110, may have a respective "internal" or "local" cache memory (not shown). Further, there may be no cache memory between the interconnect 106 and the memory device 110. Generally, the illustrated and described components may be implemented in alternative ways, including in distributed or shared memory systems. A given apparatus 102 may also include more, fewer, or different components.

The host device 104 and the various memories may be realized in multiple manners. In some cases, the host device 104 and the memory device 110 can both be disposed on, or physically supported by, a same printed circuit board (PCB) (e.g., a rigid or flexible motherboard). The host device 104 and the memory device 110 may additionally be integrated on a same IC or fabricated on separate ICs but packaged together. A memory device 110 may also be coupled to multiple host devices 104 via one or more interconnects 106 and may be able to respond to memory requests from two or more of the host devices 104. Each host device 104 may include a respective memory controller 118, or the multiple host devices 104 may share a common memory controller 118. An example computing system architecture with at least one host device 104 that is coupled to a memory device 110 is described below with reference to FIG. 2.

The electrical paths or couplings realizing the interconnect 106 can be shared between two or more memory components (e.g., modules, dies, banks, or bank groups). In some implementations, the CA bus 120 is used for transmitting addresses and commands from the memory controller 118 to the memory device 110, which transmitting may be to the exclusion of propagating data. The DQ bus 122 can propagate data between the memory controller 118 and the memory device 110. The memory device 110 may include or be configured with multiple memory banks (not shown in FIG. 1). The memory device 110 may be realized with any suitable memory and/or storage facility including, but not limited to: Dynamic Random-Access Memory (DRAM), Synchronous DRAM (SDRAM), three-dimensional (3D) stacked DRAM, Double Data Rate (DDR) memory, or Low-Power DDR (LPDDR) memory, including LPDDR DRAM and LPDDR SDRAM.

The memory device 110 may be described in terms of forming at least part of a main memory of the apparatus 102. The memory device 110 may, however, form at least part of a cache memory, a storage memory, an SoC, and so forth of an apparatus 102. As described further below (e.g., with reference to FIG. 9), in some implementations, an architecture or protocol of the memory device 110 can preclude masked-write functionality, such as by omitting provisions for performing a masked-write command and/or an internal read-modify-write operation.

As illustrated in FIG. 1, the memory device 110 can include error correction code (ECC) circuitry 112, which may include an ECC engine (not shown in FIG. 1). The ECC circuitry 112, or the ECC engine thereof, can be realized as hardware (e.g., logic) that implements an ECC algorithm or other mechanism. In some implementations, the ECC circuitry 112 can be shared among multiple banks of the memory device 110. The ECC circuitry 112 can perform multibit ECC determinations, such as 2-bit or 3-bit ECC determinations. The hardware or logic of the ECC circuitry 112 may implement, for example, a double error correction (DEC) Bose-Chaudhuri-Hocquenghem (BCH) code, a double-error-correcting and triple-error-detecting (DEC-TED) BCH code, and so forth. Other ECC algorithms and mechanisms are described below.

Figure 2:
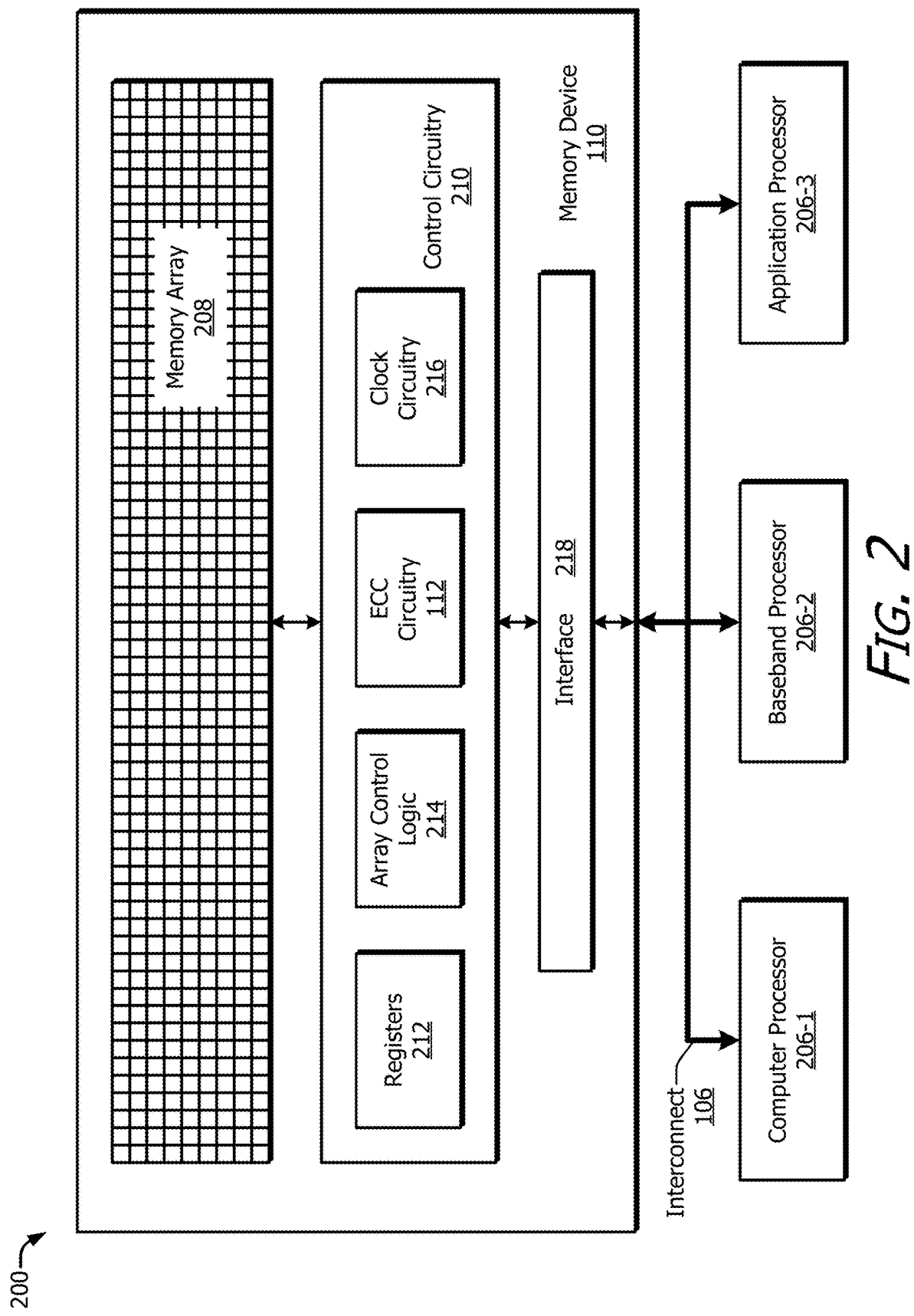
FIG. 2 illustrates example computing systems that can implement aspects of shared ECC circuitry with a memory device.

FIG. 2 illustrates an example computing system 200 that can implement aspects of shared error correction code (ECC) circuitry. In some implementations, the computing system 200 includes at least one memory device 110, at least one interconnect 106, and at least one processor 206. The memory device 110 can include, or be associated with, at least one memory array 208, at least one interface 218, and control circuitry 210 that is communicatively coupled to the memory array 208. The memory device 110 can correspond to one or more of the cache memory 108 or 116, the main memory, or a storage memory of the apparatus 102 of FIG. 1. Thus, the memory array 208 can include an array of memory cells, including but not limited to memory cells of Dynamic Random-Access Memory (DRAM), Synchronous DRAM (SDRAM), three-dimensional (3D) stacked DRAM, Double Data Rate (DDR) memory, low-power Dynamic Random-Access Memory (DRAM), or Low-Power Double Data Rate (LPDDR) Synchronous Dynamic Random-Access Memory (SDRAM). The memory array 208 and the control circuitry 210 may be components on a single semiconductor die or on separate semiconductor dies. The memory array 208 or the control circuitry 210 may also be distributed across multiple dies.

The control circuitry 210 can include any of a number of components that can be used by the memory device 110 to perform various operations. These operations can include communicating with other devices, managing performance, and performing memory read or write operations. For example, the control circuitry 210 can include one or more registers 212, at least one instance of array control logic 214, clock circuitry 216, and the ECC circuitry 112. The registers 212 may be implemented, for example, as one or more registers that can store information to be used by the control circuitry 210 or another part of the memory device 110. The array control logic 214 may be implemented as circuitry that can provide command decoding, address decoding, input/output functions, amplification circuitry, power supply management, power control modes, and other functions. The clock circuitry 216 may be implemented as circuitry that can provide synchronization of various components of the memory device 110 with one or more external clock signals that may be provided over the interconnect 106, such as a command/address clock (e.g., CK_t or CK_c) or a data clock (e.g., WCK_t or WCK_c), and/or with at least one clock signal that is generated internally.

The interface 218 can couple the control circuitry 210 or the memory array 208 directly or indirectly to the interconnect 106. As shown in FIG. 2, the registers 212, the array control logic 214, the ECC circuitry 112, and the clock circuitry 216 can be part of a single component (e.g., the control circuitry 210). In other implementations, one or more of the registers 212, the array control logic 214, the ECC circuitry 112, or the clock circuitry 216 may be implemented as separate components, which can be provided on a single semiconductor die or disposed across multiple semiconductor dies. These components of the control circuitry 210 may be individually or jointly coupled to the interconnect 106 via the interface 218.

The interconnect 106 may be implemented with any one or more of a variety of interconnects that communicatively couple together various components and enable commands, addresses, and/or other information and data to be transferred between two or more of the various components (e.g., between the memory device 110 and the one or more processors 206). Although the interconnect 106 is represented with a single arrow in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address (CA) bus 120 and a data (DQ) bus 122 (as depicted in FIG. 1).

In some aspects, the memory device 110 may be realized as a "separate" physical component relative to the host device 104 (of FIG. 1) or any of the processors 206. Examples of physical components that may be separate include, but are not limited to, a printed circuit board (PCB), which can be rigid or flexible; a memory card; a memory stick; and a memory module, including a single in-line memory module (SIMM) or a dual in-line memory module (DIMM). Thus, separate physical components may be located together within a same housing of an electronic device or may be distributed over a server rack, a data center, and so forth. Alternatively, the memory device 110 may be packaged or integrated with other physical components, including a host device 104 or a processor 206, such as by being combined on a common PCB or together in a single device package or by being integrated into an SoC.

The apparatuses and methods that are described herein may be appropriate for memory that is designed for lower-power operations or that is targeted for energy-efficient applications. Thus, the described principles may be incorporated into a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

As shown in FIG. 2, the one or more processors 206 may include a computer processor 206-1, a baseband processor 206-2, and an application processor 206-3, which are coupled to the memory device 110 through the interconnect 106. The processors 206 may each be, or may form a part of, a CPU, a GPU, an SoC, an ASIC, an FPGA, or the like. In some cases, a single processor can comprise multiple processing resources, each dedicated to different functions, such as modem management, applications, graphics, central processing, or the like. In some implementations, the baseband processor 206-2 may include or be coupled to a modem (not shown in FIG. 2) and may be referred to as a modem processor. The modem and/or the baseband processor 206-2 may be coupled wirelessly to a network via, for example, cellular, Wi-Fi®, Bluetooth®, near field, or another technology or protocol for wireless communication.

In some implementations, the processors 206 may be connected directly to the memory device 110 (e.g., via the interconnect 106 as shown). In other implementations, one or more of the processors 206 may be indirectly connected to the memory device 110 (e.g., over a network connection or through one or more other devices). Further, each processor 206 may be realized similarly to the processor 114 of FIG. 1. Accordingly, a respective processor 206 can include or be associated with a respective memory controller, like the memory controller 118 depicted in FIG. 1. Alternatively, two or more processors 206 may access the memory device 110 using a shared or system memory controller 118.

The ECC circuitry 112 can provide ECC functionality for data stored in the memory array 208. The ECC circuitry 112 can, for instance, determine an ECC value for storage as part of a write operation or for comparison with a stored ECC value as part of a read operation. Example operations for the ECC circuitry 112 are described below with reference to FIGS. 4 and 8. Example implementations in which the memory array 208 includes multiple memory banks are presented below with reference to FIGS. 4 and 5. Example architectures for internal data buses are described with reference to FIGS. 6 and 7. However, example hardware realizations of a memory device 110 are described next with reference to FIG. 3.

Example Techniques and Hardware

Figure 3:
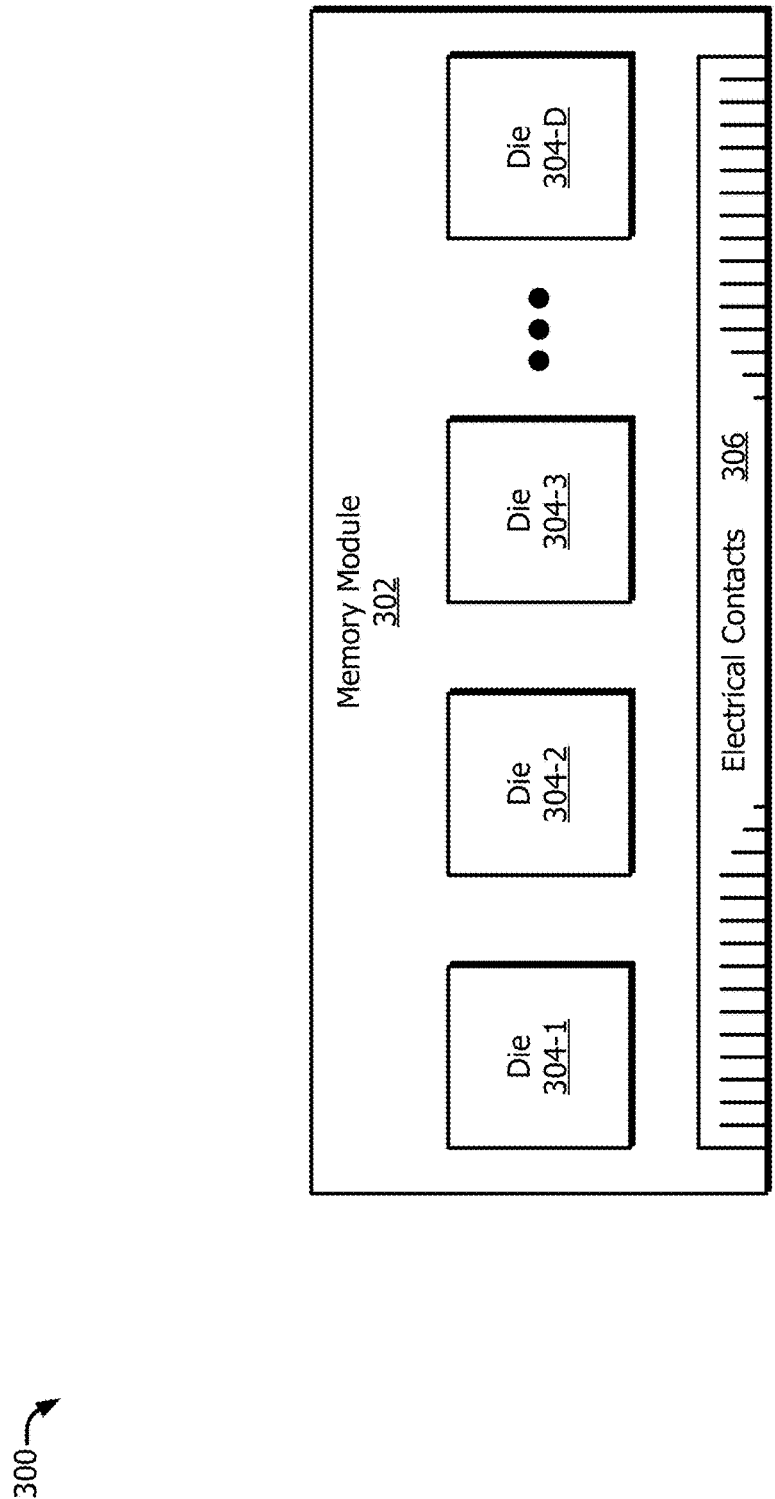
FIG. 3 illustrates memory device examples.

FIG. 3 illustrates memory device examples at 300. An example memory module 302 includes multiple dies 304. As depicted, the memory module 302 includes a first die 304-1, a second die 304-2, a third die 304-3, . . . , and a D$^{th}$ die 304-D, with "D" representing a positive integer. The memory module 302 can be realized as a SIMM or a DIMM, just to name a couple of examples. A memory device 110 can correspond, for example, to a single die 304, multiple dies 304-1 . . . 304-D, a memory module 302 with at least one die 304, and so forth. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 . . . 304-D may be mounted or otherwise disposed on the PCB. The dies 304 (e.g., memory dies) may be arranged in a line or along two or more dimensions (e.g., like a grid or array). The dies 304 may have a common size or may have different sizes. Each die 304 may be like one or more other dies 304 or may be unique on a given memory module 302 in terms of size, shape, data capacity, control circuitries, and so forth. Dies 304 may also be distributed on multiple sides of the memory module 302.

Figure 4:
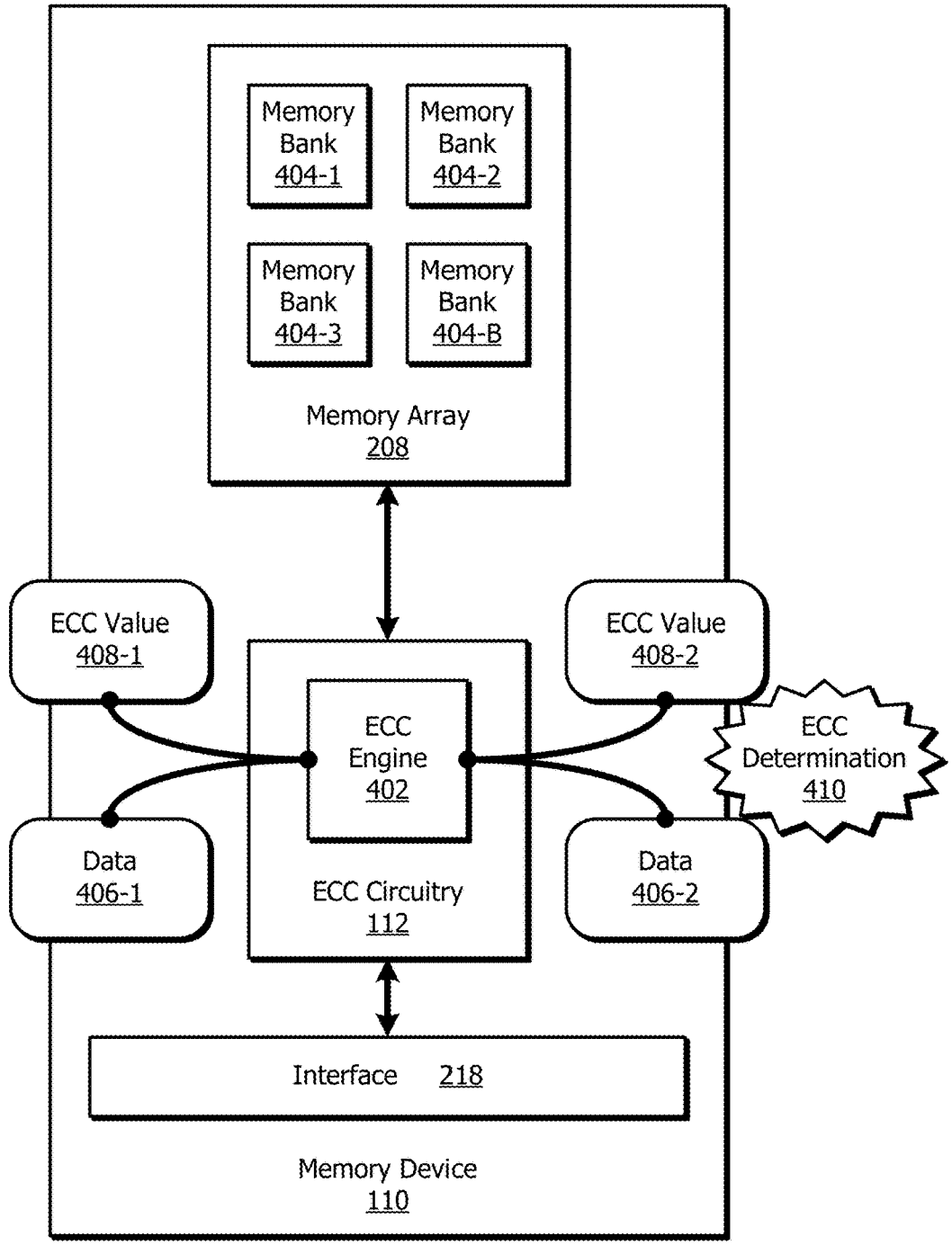
FIG. 4 illustrates examples of a memory device that includes ECC circuitry coupled to a memory array with multiple memory banks.

FIG. 4 illustrates, at architectures 400, examples of a memory device 110 that includes ECC circuitry 112 coupled to a memory array 208, which includes multiple memory banks 404. The multiple memory banks 404 can include at least two memory banks, at least three memory banks, at least four memory banks, and so forth. As shown, the memory array 208 includes a first memory bank 404-1, a second memory bank 404-2, a third memory bank 404-3, . . . , and a "B$^{th}$" memory bank 404-B, with "B" representing a positive integer greater than one (e.g., B>=2). In example implementations, the interface 218 is coupled to the memory array 208 and the ECC circuitry 112. More specifically, the ECC circuitry 112 can be coupled between the interface 218 and the memory array 208, at least with respect to ECC functions. To provide ECC functionality, the ECC circuitry 112 includes at least one ECC engine 402. The ECC engine 402 can be implemented as, for example, a multibit ECC engine that comprises an N-bit ECC engine in which "N" is greater than one (1)—e.g., two (2) or larger.

The ECC circuitry 112 can provide ECC functionality to the multiple memory banks 404-1 . . . 404-B. For example, the ECC circuitry 112 can provide ECC functionality to two or more memory banks 404, such as the first memory bank 404-1 and the second memory bank 404-2. In some cases, the ECC circuitry 112 can provide ECC functionality to each of the multiple memory banks 404-1 . . . 404-B, where the quantity "B" may represent all or less than all of the memory banks that are within the memory array 208 or that are disposed on a given die 304 (of FIG. 3). The ECC circuitry 112 can also provide ECC functionality to all of the multiple memory banks 404-1 . . . 404-B on a single die 304, where the quantity "B" represents all of the memory banks that are within the memory array 208 or that are disposed on the single die 304.

The ECC functionality can include performing an ECC determination 410. To perform the ECC determination 410, the ECC engine 402 determines at least one ECC value 408 based on data 406. The ECC engine 402 can use any ECC algorithm or combination of multiple ECC algorithms to compute the ECC value 408. Examples of ECC algorithms include those relating to block codes, such as Hamming codes, Reed-Solomon codes, Golay codes, Bose-Chaudhuri-Hocquenghem (BCH) codes, multidimensional codes, other ECC coding schemes described herein, and the like. However, the ECC engine 402 can employ one or more alternative ECC algorithms for block codes or employ an alternative coding scheme.

The ECC engine 402 can employ ECC algorithms of varying strengths or capabilities. These strengths or capabilities may at least partially be indicated by, or correspond to, a bit-length of the ECC processing. Example bit lengths are one-bit and multibit ECC processing. Multibit ECC processing includes two-bit (2-bit), three-bit (3-bit), four-bit (4-bit), and so forth. By way of example, one-bit ECC processing may enable detection of one error bit but no or limited error correction. In contrast, two-bit ECC processing may enable detection of up to two error bits and correction of one error bit. Generally, more ECC bits can entail circuitry that consumes more area or performs ECC processes more slowly. For instance, transitioning from ECC1 (one-bit ECC) to ECC2 (two-bit ECC) can entail an area increase of three to four times (3-4x). In some implementations, a quantity of ECC bits corresponds to a quantity of bits (or a length of) each ECC value 408 (e.g., an ECC value 408 may have two bits in an ECC2 system).

In example operations, the ECC engine 402 accepts data 406 and produces an ECC value 408 based on the data using some ECC algorithm. As shown in FIG. 4, first data 406-1 corresponds to the first memory bank 404-1, and second data 406-2 corresponds to the second memory bank 404-2. Here, data 406 can correspond to a given memory bank 404 if the data 406 is stored in the memory bank 404 (e.g., and is being processed as part of a read operation) or is destined for storage in the memory bank 404 (e.g., and is being processed as part of a write operation). In one ECC determination 410, the ECC engine 402 determines the first ECC value 408-1 based on the first data 406-1. In another ECC determination 410, the ECC engine 402 determines the second ECC value 408-2 based on the second data 406-2.

The ECC value 408 can be stored in association with the corresponding data 406 from which the ECC value is generated. For example, the ECC value 408 can be stored in, or at least at, the same memory bank 404 as the associated data 406. In this case, the first ECC value 408-1 can be stored in the first memory bank 404-1 with the associated first data 406-1 (e.g., in the same row). Additionally or alternatively, the ECC value 408 can be stored in, or at least at, the ECC circuitry 112 in a table or other memory (not shown) that holds ECC values. The ECC circuitry 112 can include or have access to, for instance, an ECC-dedicated memory or a memory that stores memory protection information generally (e.g., ECC values, hash codes, or encryption data). For this latter case, the first ECC value 408-1 can be stored in a memory at the ECC circuitry 112 in association with the first data 406-1, such as in a location corresponding to the address at which the first data 406-1 is stored at the first memory bank 404-1.

At least a portion of the ECC circuitry 112 (e.g., including the ECC engine 402) can comprise or realize ECC logic. Thus, in some implementations, the ECC engine 402 of the ECC circuitry 112 can provide ECC determinations 410 for two or more of the multiple memory banks 404-1 ... 404-B. The ECC circuitry 112 can provide other ECC functionality, like interacting with the interface 218 or an internal bus (not shown in FIG. 4) to receive or transmit data 406 or an ECC value 408 to an external interconnect (e.g., the interconnect 106 of FIGS. 1 and 2) or to the memory array 208. ECC functionality can further include determining if at least one error has occurred, correcting an error, signaling to other control circuitry that an error has occurred, and so forth. Examples of additional ECC functionality are described further below with reference to FIG. 8.

Figure 5:
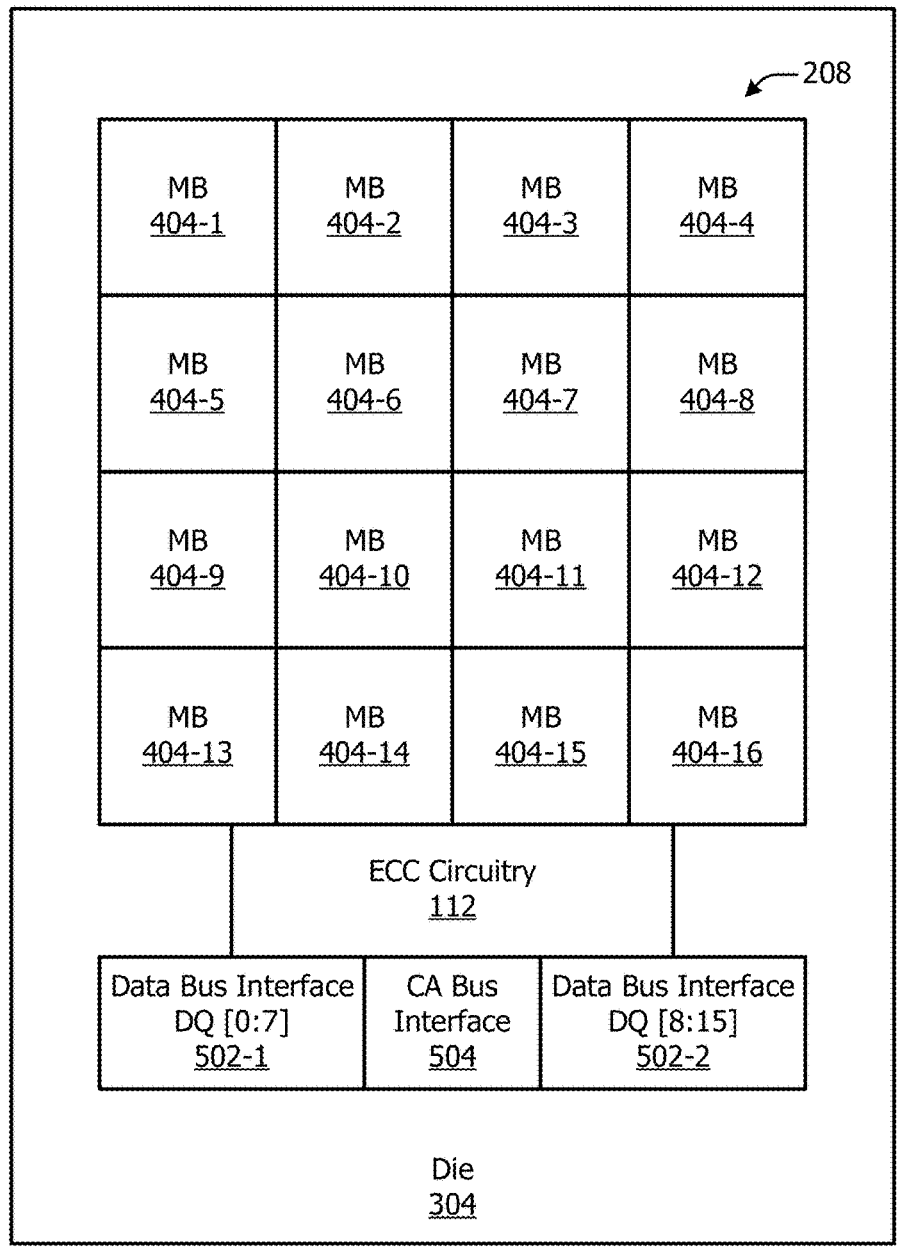
FIG. 5 illustrates example architectures for a memory device that includes ECC circuitry and multiple memory banks.

FIG. 5 illustrates example architectures 500 for a memory device that includes ECC circuitry 112 and multiple memory banks 404 on a die 304. As shown, the memory array 208 includes 16 memory banks 404-1 ... 404-16 that are arranged in a 4×4 grid, with each memory bank represented by "MB." A first row includes memory banks 404-1 to 404-4; a second row includes memory banks 404-5 to 404-8; a third row includes memory banks 404-9 to 404-12; and a fourth row includes memory banks 404-13 to 404-16. Other implementations, however, may include a different quantity of memory banks, a different organization or layout of memory banks, and so forth.

The die 304 also includes multiple interfaces that may form part of the interface 218 (e.g., of FIGS. 2 and 4). These multiple interfaces can include a first data bus interface 502-1 for a lower byte of data—including or corresponding to the DQ pins [0:7]—and a second data bus interface 502-2 for an upper byte of data—including or corresponding to the DQ pins [8:15]. The first and second data bus interfaces 502-1 and 502-2 can interface with the data (DQ) bus 122 (of FIG. 1). These multiple interfaces of the die 304 can also include a command and address (CA) bus interface 504 to interface with the command and address (CA) bus 120 (of FIG. 1).

In some implementations, the architectures 500 can represent a memory device 110 (e.g., of FIGS. 1, 2, and 4) in which a DRAM architecture omits masked-write operations or allows for such operations to be selectively enabled or disabled. Such a DRAM architecture can also incorporate ECC2 (or another multibit ECC) for greater reliability and better die-area utilization based on sharing the ECC2 circuitry. The architecture 500 is shown as a single die 304 that can be realized as a low-power double data rate (LPDDR) synchronous dynamic random-access memory (SDRAM) with 16 memory banks 404-1 ... 404-16. In other implementations, the memory array 208 can be another type of memory (e.g., as described with reference to the example memories of FIGS. 1 and 2) or another configuration of the illustrated banked LPDDR. Other configurations may include, for example, a different number of banks (e.g., two or more banks, including two banks, four banks, or eight banks) or a different configuration of banks (e.g., a grouped bank configuration, including four groups of four memory banks each).

The architecture 500 also includes ECC logic as indicated by the ECC circuitry 112. The ECC circuitry 112 can be realized with hardware that implements at least one multibit ECC scheme, such as with a 2-bit or a 3-bit ECC engine (an ECC2 or ECC3 engine). For example, the ECC engine 402 (e.g., of FIG. 4) may be included as part of the ECC circuitry 112. In some implementations, the ECC circuitry 112, including the ECC engine 402, is shared among multiple banks 404 of the memory array 208. For example, the ECC circuitry 112 can be shared between some (e.g., two or more), including up to all, of the 16 memory banks 404-1 ... 404-16 via one or more data paths (not shown in FIG. 5). The data paths may include one or more wires or sets of wires that are common between two or more banks, that are separate between banks, or partially common and partially separate between banks. Examples of such data path implementations are described below with reference to FIGS. 6 and 7.

As described above, the die 304 (or memory device 110) can also include a command and address (CA) interface 504 and a data (DQ) interface 502 (shown as 502-1 and 502-2). In some implementations, the die 304 (or memory device 110) may also include a chip-select (CS) interface (not shown), or any combination thereof. For example, the CA interface 504 can correspond to or be coupled to the command address bus 120 (e.g., can represent CA pins on a DDR memory device). The DQ interface 502 can correspond to or be coupled to the DQ bus 122 (e.g., can represent DQ pins on a DDR memory device).

In some implementations, the architecture 500 of the memory device omits circuitry to perform a masked-write command, which can correspond to omitting an internal read-modify-write operation. Thus, the memory device may preclude use of a masked-write command in this manner. This eliminates a memory access operation with a relatively high tCCD count (where "tCCD" represents a minimum column-to-column command delay time) and enables the omission of supporting control circuitry, which occupies space on the die. Precluding masked-write commands can also avoid incurring a performance penalty that may occur if a read-modify-write internal operation were performed while the supporting ECC circuitry is physically remote from the relevant memory bank. The architecture 500 may alternatively preclude use of a masked-write command in a different manner by incorporating circuitry to selectively enable or disable a masked-write functionality as is described below with reference to FIG. 9.

Figure 6:
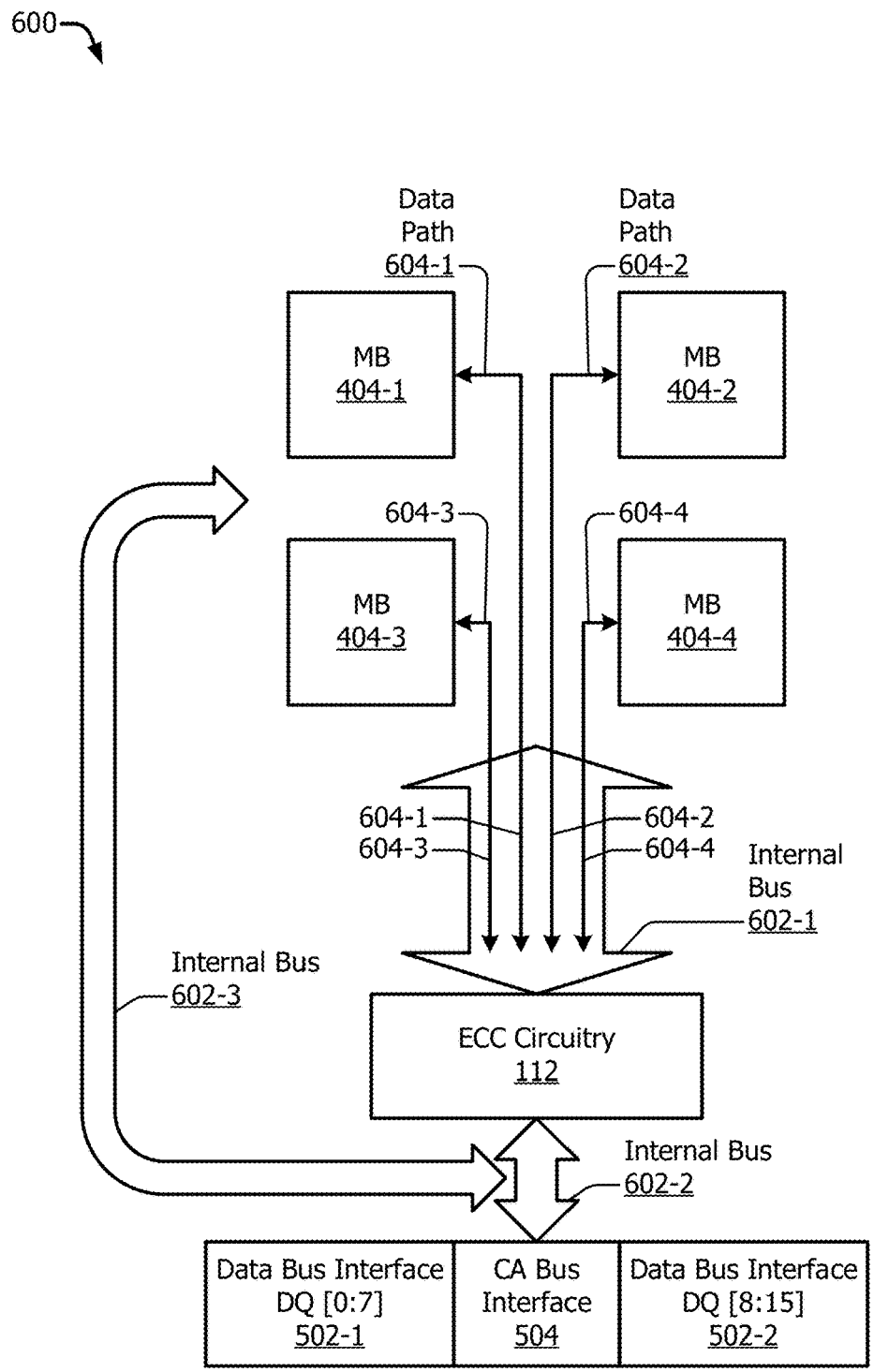
FIGS. 6 and 7 illustrate example architectures for memory devices that include ECC circuitry, multiple memory banks, and one or more internal data buses.
Figure 7:
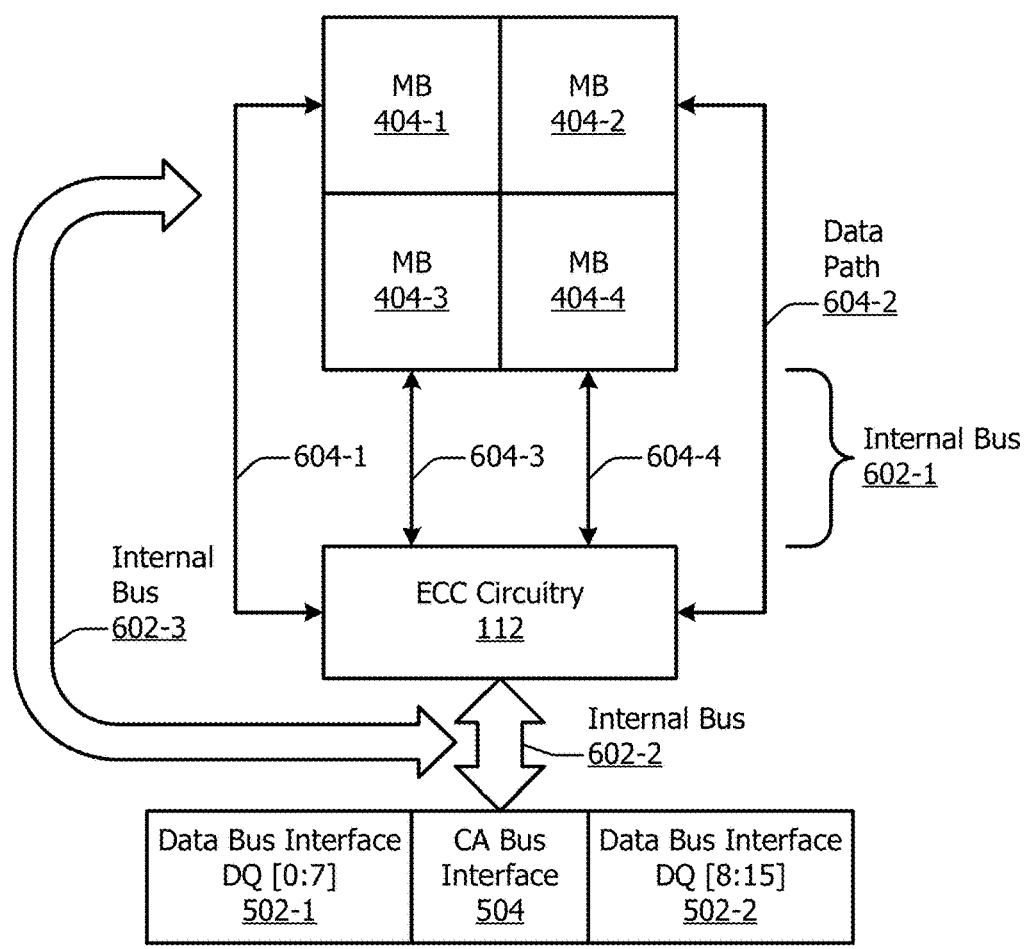

FIGS. 6 and 7 illustrate example architectures 600 and 700 with internal data buses 602-1, 602-2, and 602-3 for memory devices that include ECC circuitry 112 and multiple memory banks 404-1 to 404-4. The example architectures 600 and 700 are depicted with an example four memory banks 404-1 to 404-4 (e.g., with the variable "B" of FIG. 4 equaling at least four); however, the principles are applicable to smaller or larger quantities of memory banks. As shown, the architectures 600 and 700 can include multiple internal buses 602 for a memory device 110 (e.g., of FIGS. 1, 2, and 4). The first and second internal buses 602-1 and 602-2 respectively couple the ECC circuitry 112 to the multiple memory banks 404-1 to 404-4 and to the data and CA bus interfaces 502 and 504.

As shown in FIGS. 6 and 7, a memory architecture that employs shared ECC circuitry may also or instead include a third internal bus 602-3. The third internal bus 602-3 can couple the multiple memory banks 404-1 to 404-4 to the data and CA bus interfaces 502 and 504 without traversing the ECC circuitry 112. The third internal bus 602-3 therefore enables data or control signal propagation to bypass the ECC circuitry 112 or the ECC engine 402 thereof.

In example implementations, the first internal bus 602-1 is coupled between the ECC circuitry 112 and the multiple memory banks 404-1 to 404-4, and the second internal bus 602-2 is coupled between the ECC circuitry 112 and the data and CA bus interfaces 502 and 504. Each internal bus 602 may include multiple wires for propagating data or control signaling, in conjunction with any buffers, latches, switches, multiplexers, etc. that are used for propagation or routing control. The first internal bus 602-1 includes multiple data paths 604: a first data path 604-1, a second data path 604-2, a third data path 604-3, a fourth data path 604-4, and so forth. Each data path 604 of two or more data paths may include a set of wires to propagate signals, so the multiple data paths 604-1 to 604-4 may together include multiple sets of wires.

The data paths 604 may have a quantity equal to a quantity of the multiple memory banks 404-1 . . . 404-B, which is four in FIG. 6. Thus, a respective data path 604-1, 604-2, 604-3, or 604-4 of multiple data paths 604-1 to 604-4 couples a respective memory bank 404-1, 404-2, 404-3, or 404-4 of multiple memory banks 404-1 to 404-4 to the ECC circuitry 112. Each respective data path 604 can include a shared or respective set of wires that can propagate data or an ECC value between the ECC circuitry 112 and a respective memory bank 404.

In the example architecture 600 as depicted in FIG. 6, at least one data path 604 has a common or shared portion with another data path 604 of the first internal bus 602-1. For example, a portion of the first internal bus 602-1 that is proximate to, or interfaces with, the ECC circuitry 112 can provide a shared pathway for each data path 604 of the multiple data paths 604-1 to 604-4. In contrast, in the example architecture 700 as depicted in FIG. 7, each data path 604 of the multiple data paths 604-1 to 604-4 can be separate from each other data path 604 of the first internal bus 602-1. For example, each respective data path 604 can have a separate respective interface with the ECC circuitry 112. As illustrated, the first data path 604-1 may provide a separate propagation route between the first memory bank 404-1 and the ECC circuitry 112, and the second data path 604-2 may provide a separate propagation route between the second memory bank 404-2 and the ECC circuitry 112. Similarly, the third data path 604-3 may provide a separate propagation route between the ECC circuitry 112 and the third memory bank 404-3, and the fourth data path 604-4 may provide a separate propagation route between the ECC circuitry 112 and the fourth memory bank 404-4.

Figure 8:
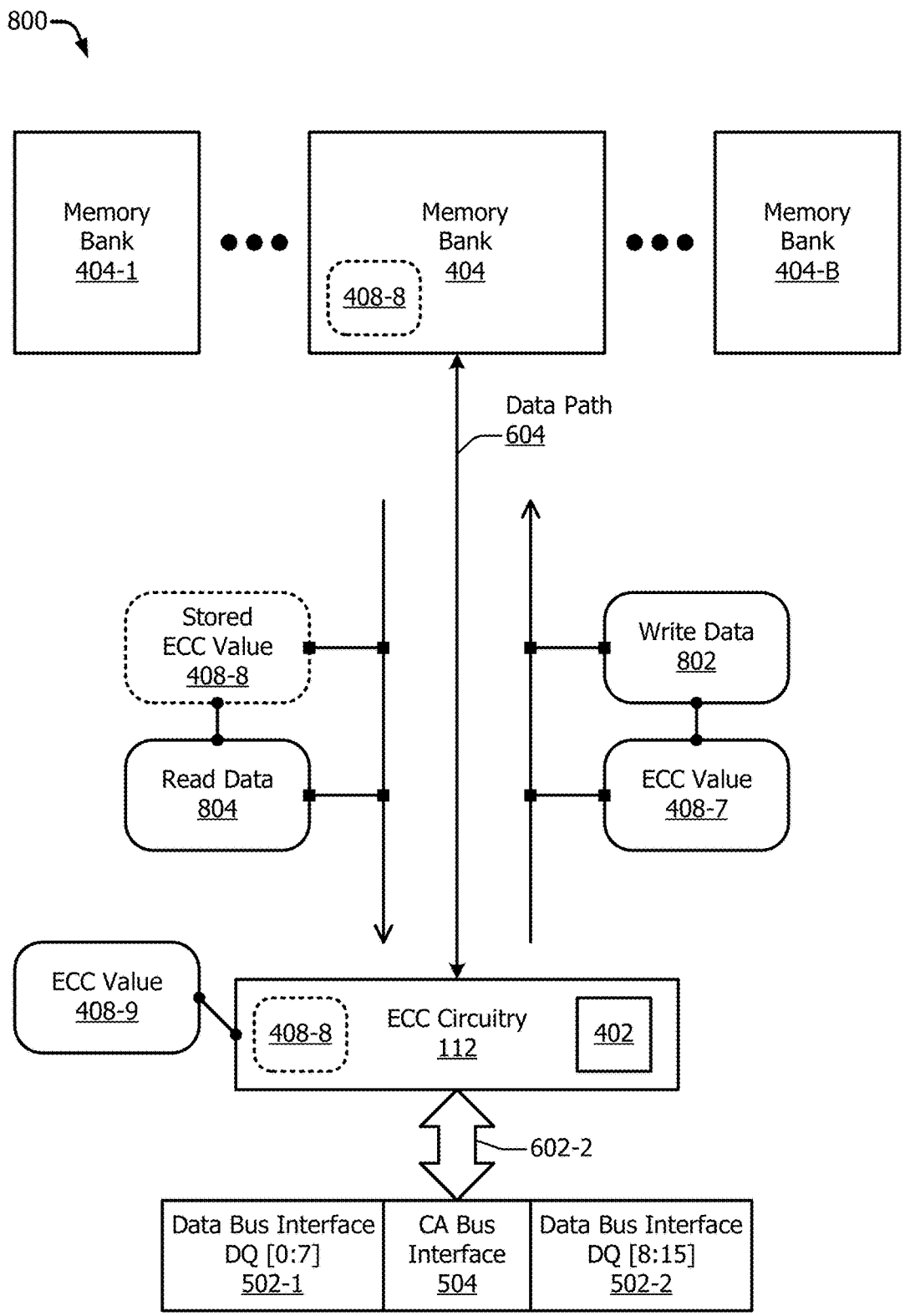
FIG. 8 illustrates example operations of ECC circuitry with respect to read operations and write operations.

FIG. 8 illustrates, with a protocol 800, example operations of ECC circuitry 112 for read operations and write operations. FIG. 8 also illustrates example locations for storing ECC values 408. The example operations are described in terms of the memory bank 404 and a corresponding data path 604; however, the ECC circuitry 112 can perform such operations for two or more memory banks of the multiple memory banks 404-1 . . . 404-B. In an example write operation, the ECC circuitry 112 receives write data 802 from the data bus interface 502. The ECC engine 402 of the ECC circuitry 112 determines an ECC value 408-7 based on the write data 802. The write data 802 is stored in the memory bank 404 based on the memory address associated with the write data 802. The ECC circuitry 112 can transmit or forward the write data 802 to the memory bank 404 via the data path 604. Alternatively, the array control logic 214 (of FIG. 2) can transmit the write data 802 to the memory bank 404 via the data path 604 or another bus, such as the third internal bus 602-3 of FIGS. 6 and 7.

The ECC circuitry 112 can also store the ECC value 408-7—e.g., write the ECC value 408 to one or more memories on the die as a stored ECC value 408-8. The ECC value 408-7 can be stored in association with the write data 802. The ECC value 408-7 can be stored in the memory bank 404 in association with the write data 802, can be stored "centrally" with other ECC values associated with data stored in other memory banks, and so forth. For instance, the ECC value 408-7 can be stored in a row with the write data 802 or otherwise in relation to the write data 802 at the memory bank 404. Alternatively, the ECC value 408-7 can be stored at least proximate to the ECC circuitry 112 (e.g., near or as part of the ECC circuitry 112) and in association with the respective write data 802 (e.g., based on the memory address thereof). The control circuitry 210 (of FIG. 2) can alternatively store the ECC value 408-7 in a memory—the memory bank 404 or a memory associated with the ECC circuitry 112. Regardless, an ECC value 408 (e.g., the ECC value 408-7) that is stored in a memory can be referred to as a stored ECC value 408-8. Example instances of a stored ECC value 408-8 are depicted as being associated with read data 804 during propagation on an internal bus, as being stored with the ECC circuitry 112, and as being stored at the memory bank 404. A stored ECC value 408-8 may, however, be stored elsewhere or propagated differently than is shown.

In an example read operation, the ECC circuitry 112 receives read data 804 that is stored in the memory bank 404. The ECC circuitry 112 can retrieve the read data 804 "directly," or the array control logic 214 can provide the read data 804 to the ECC circuitry 112. The ECC circuitry 112 also obtains (e.g., retrieves, extracts, or reads) the stored ECC value 408-8 from the memory bank 404, from a "local" memory for the ECC circuitry 112, or from another memory. In some cases, the stored ECC value 408-8 can be retrieved automatically as part of retrieving the read data 804 for a read memory access operation. Alternatively, the ECC circuitry 112 or the control circuitry 210 can obtain the stored ECC value 408-8 in a separate operation.

The ECC engine 402 of the ECC circuitry 112 determines an ECC value 408-9 based on the read data 804. If the determined ECC value 408-9 matches the stored ECC value 408-8, the read data 804 can be coupled to the data bus interface 502 without further processing—e.g., the ECC circuitry 112 can authorize the forwarding of the read data 804 to the bus interface 502 that is coupled to the interconnect 106. At times, however, the determined ECC value 408-9 will not match the stored ECC value 408-8 if one or more bits have been corrupted. If the determined and stored ECC values do not match, then the ECC circuitry 112 has detected an error and can perform at least one other action to implement an ECC-based technique. For example, the ECC circuitry 112 can correct the error if the quantity of bit errors can be overcome by the level of ECC provided (e.g., a one-bit error with ECC2), can forward corrected read data to the data bus interface 502, can signal that an error has been detected, can signal that an error has been detected and corrected, a combination thereof, and so forth.

Figure 9:
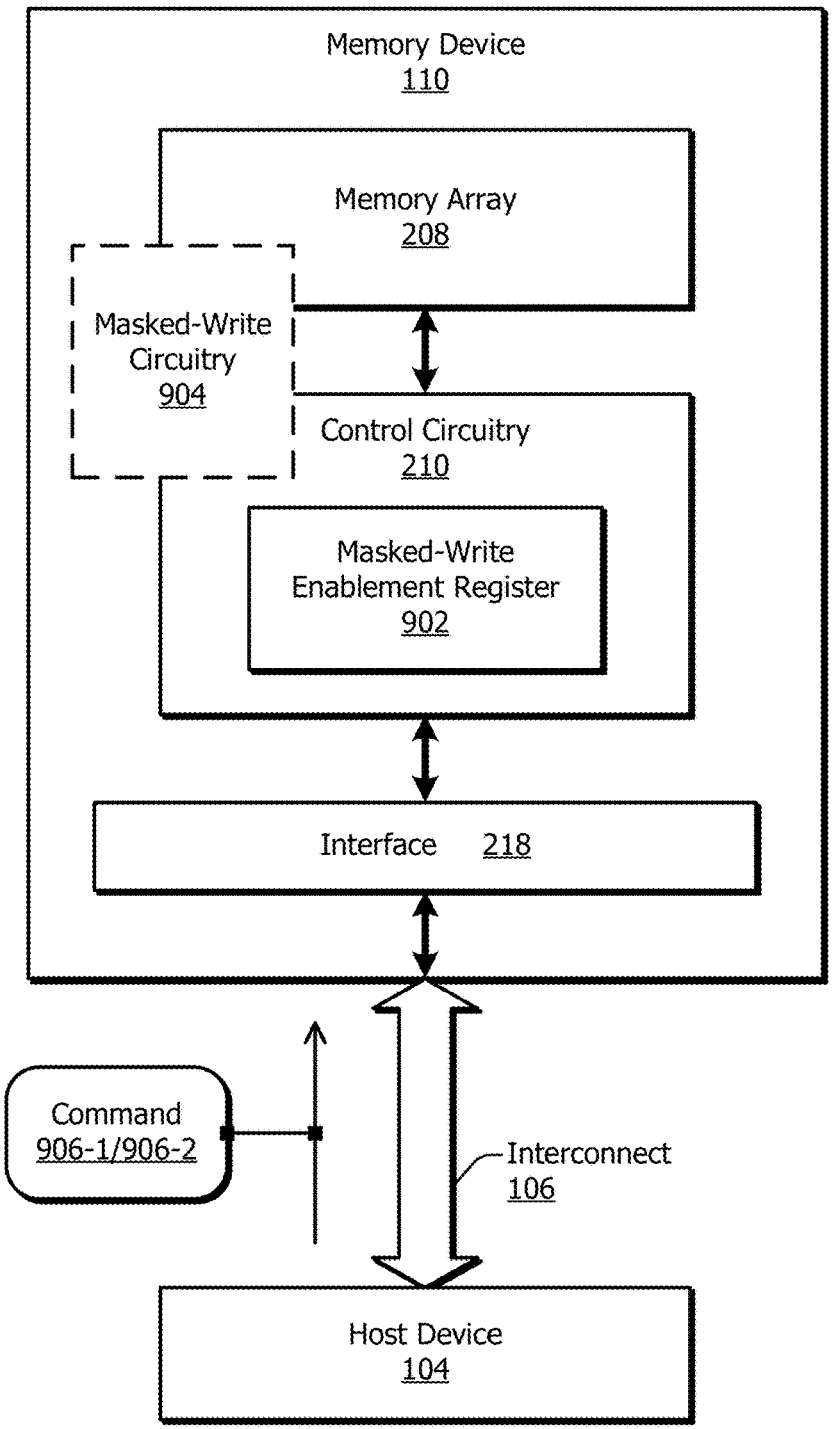
FIG. 9 illustrates example interactions between a host device and a memory device to implement selective enablement of masked-write functionality.

FIG. 9 illustrates at 900 generally example interactions between a host device 104 and a memory device 110 to implement selective masked-write enablement. In some implementations, a memory device 110 can have a memory architecture or protocol that precludes use of a masked-write command. As described above, the memory device 110 may implement the masked-write command using an internal read-modify-write operation. The memory device 110 may lack the architecture and the protocol to provide masked-write functionality. Alternatively, the memory device 110 may include an architecture or a protocol that permits masked-write functionality to be selectively enabled or disabled.

In some environments, a write command may be completed within one tCCD (minimum column-to-column command delay time). A masked-write command, in contrast, can consume or occupy four tCCDs because the command comprises an atomic command that may be completed using the multiple commands of read, modify, and write. This four-unit tCCD duration corresponds to ECC circuitry that is positioned proximate to the memory bank. There is, therefore, a relatively small propagation delay between the read-modify-write circuitry at the memory bank and the ECC circuitry due to the physical proximity.

If, on the other hand, the ECC circuitry 112 is positioned farther from at least some of the multiple memory banks 404 like this document describes for example implementations of shared ECC circuitry, there may be an appreciable propagation delay that can stretch the time duration for performing a masked-write operation to five, six, or more tCCD units. For some systems, such a delay is undesirable, so these systems can omit circuitry for intrinsically performing a masked-write command to conserve chip area and to simplify chip layout or data array topology. Other systems, however, may accommodate legacy programs, conventional processing approaches, or existing hardware. To do so, a memory device 110 may provide a selectively engageable masked-write functionality.

As illustrated in FIG. 9, the memory device 110 can include masked-write circuitry 904 that can implement a masked-write command using, for example, an internal read-modify-write operation. The masked-write circuitry 904 can be selectively activated and deactivated in described implementations. The control circuitry 210 may include at least one masked-write enablement register 902. The masked-write enablement register 902 may be part of the one or more registers 212 (of FIG. 2). One value (e.g., a "1") of the masked-write enablement register 902 enables the masked-write functionality provided by the masked-write circuitry 904, and another value (e.g., a "0") of the masked-write enablement register 902 disables the masked-write functionality.

In example operations, the host device 104 can transmit a command 906-1 (e.g., a masked-write enable command) to enable masked-write functionality provided by the masked-write circuitry 904. The enable command 906-1 can, for instance, set the masked-write enablement register 902 to enable the masked-write functionality by activating the masked-write circuitry 904. While the masked-write enablement register 902 is set, the memory device 110 performs masked-write operations responsive to receipt of a masked-write command over the interconnect 106. The host device 104 can also transmit another command 906-2 (e.g., a masked-write disable command) for disabling the masked-write functionality provided by the masked-write circuitry 904. Based on the other command 906-2 (e.g., the disable command 906-2), the control circuitry 210 can clear the masked-write enablement register 902 to disable the masked-write functionality by deactivating the masked-write circuitry 904. While the masked-write enablement register 902 is, for example, cleared, the masked-write command is precluded, and the memory device 110 does not perform masked-write operations. In some cases, the masked-write enablement register 902 can contain more than one bit to establish various modes or masked-write functionality separately for different memory banks or groups thereof.

Example Methods

Figure 10:
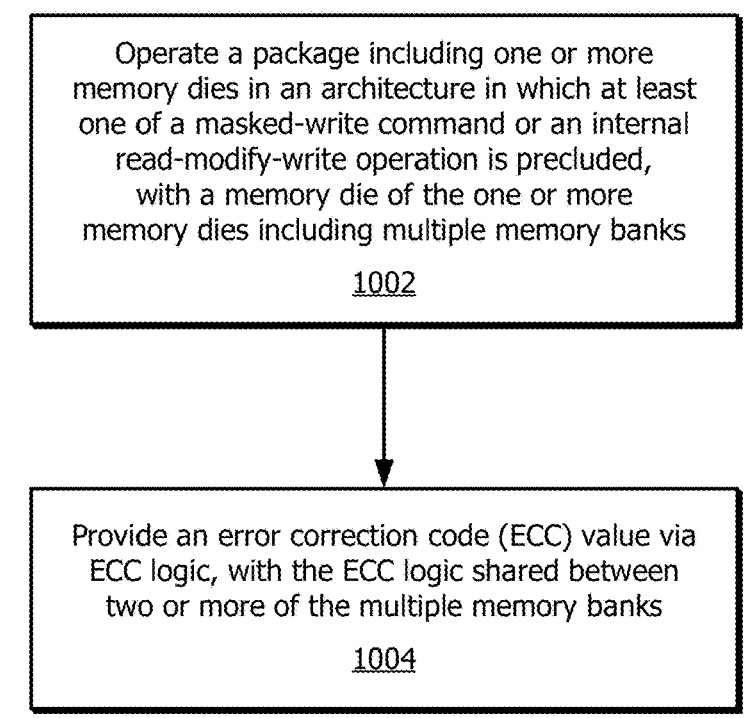
FIG. 10 illustrates a flow diagram for an example process that implements shared ECC circuitry.
Figure 11:
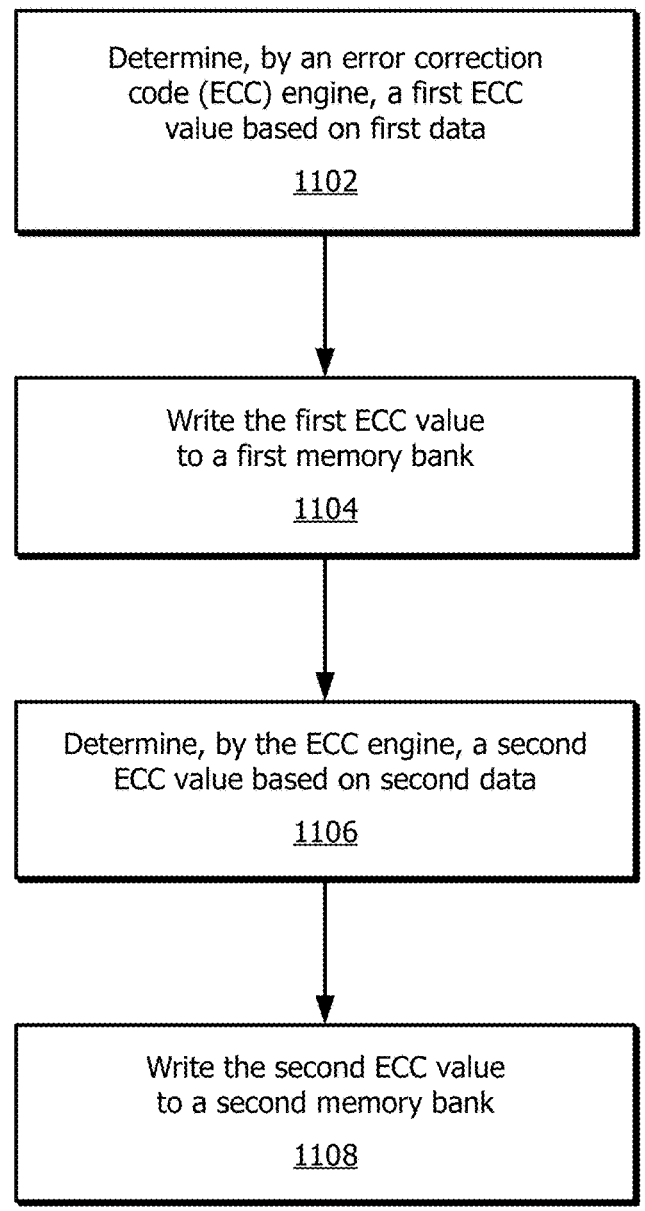
FIG. 11 illustrates a flow diagram for another example process that implements shared ECC circuitry.

This section describes example methods with reference to the flow chart(s) and flow diagram(s) of FIGS. 10 and 11 for implementing shared error correction code (ECC) circuitry. These descriptions may also refer to components, entities, and other aspects depicted in FIGS. 1-9, which reference is made only by way of example.

FIG. 10 illustrates a flow diagram for an example process 1000 that implements shared ECC circuitry. At block 1002, an apparatus is operating a package including one or more memory dies in an architecture in which at least one of a masked-write command or an internal read-modify-write operation is precluded, with a memory die of the one or more memory dies including multiple memory banks. For example, an apparatus 102 can operate a package (e.g., a memory module 302 or one or more dies 304 combined into a chip carrier) including one or more dies 304 in an architecture 400-900 in which at least one of a masked-write command or an internal read-modify-write operation is precluded. Here, a memory die 304 of the one or more memory dies 304-1 to 304-D (where "D" is one or greater) includes multiple memory banks 404-1 . . . 404-B (where "B" is two or greater). To preclude the masked-write command or the internal read-modify-write operation, the architecture may omit hardware or protocols that provide such functionality, or the architecture may include hardware or protocols that provide such functionality but also include hardware or protocols that enable the functionality to be selectively activated or deactivated (e.g., using a command 906).

At block 1004, the apparatus is providing an ECC value via ECC logic, with the ECC logic shared between two or more of the multiple memory banks. For example, the apparatus 102 can provide an ECC value 408 via ECC logic (e.g., the ECC circuitry 112, the ECC engine 402, or a portion or combination thereof). In this case, the ECC logic can be shared between two or more of the multiple memory banks 404-1 . . . 404-B. To do so, the ECC engine 402 may determine the ECC value 408 based on data 406 as part of a read operation for verifying data integrity using a stored ECC value 408-8 or as part of a write operation to establish a stored ECC value 408-8 for subsequent verification. The ECC value determination may be performed using a multibit ECC algorithm.

FIG. 11 illustrates a flow diagram for an example process 1100 that implements shared ECC circuitry. At block 1102, an apparatus is determining, by an ECC engine, a first ECC value based on first data. For example, a memory device 110 can determine, using an ECC engine 402, a first ECC value 408-1 based on first data 406-1. To do so, the ECC engine 402 may apply a multibit ECC algorithm to the first data 406-1 to make an ECC determination 410 as part of or in conjunction with a read or write operation. Here, the first data 406-1 is stored in, or otherwise corresponds to, the first memory bank 404-1.

At block 1104, the apparatus is writing the first ECC value to a first memory bank. For example, the memory device 110 can write the first ECC value 408-1 to the first memory bank 404-1. The ECC circuitry 112 may, for instance, transmit the first ECC value 408-1 to the first memory bank 404-1 via a first data path 604-1 for storing at the first memory bank 404-1. The first ECC value 408-1 may be stored in a same row with the corresponding data or in separate row of the first memory bank 404-1. The ECC values may be stored in an area of the first memory bank 404-1 that is dedicated to ECC values or in an area that also stores the corresponding data. The ECC values may be written in parallel with the corresponding data or sequentially. Alternatively, the first ECC value 408-1 may be stored in another memory that is separate from the first memory bank 404-1. This separate memory may also hold ECC values for corresponding data that is stored in other memory banks besides the first memory bank 404-1, such as a memory that is dedicated to ECC values or is proximate to the ECC circuitry 112. Regardless of where or how the first ECC value 408-1 is stored, control circuitry 210 (e.g., the ECC circuitry 112 or the array control logic 214) may write the first data 406-1 to the first memory bank 404-1 for a write operation, or it may read the first data 406-1 from the first memory bank 404-1 for a read operation.

At block 1106, the apparatus is determining, by the ECC engine, a second ECC value based on second data. For example, the memory device 110 can determine, using the ECC engine 402, a second ECC value 408-2 based on second data 406-2. To do so, the ECC engine 402 may apply a multibit ECC algorithm to the second data 406-2 to make another ECC determination 410 as part of a read or write operation. Because the second data 406-2 is stored in, or otherwise corresponds to, the second memory bank 404-2, the ECC engine 402 operates on data from at least two memory banks 404 and is thus shared between two or more memory banks 404.

At block 1108, the apparatus is writing the second ECC value to a second memory bank. For example, the memory device 110 can write the second ECC value 408-2 to a second memory bank 404-2. The ECC circuitry 112 may, for instance, transmit the second ECC value 408-2 to the second memory bank 404-2 via a second data path 604-2 for storing at the second memory bank 404-2. The second ECC value 408-2 may be stored in a same row with the corresponding data or in separate row of the second memory bank 404-2. The ECC values may be stored in an area of the second memory bank 404-2 that is dedicated to ECC values or in an area that also stores the corresponding data. The ECC values may be written in parallel with the corresponding data or sequentially. Alternatively, the second ECC value 408-2 may be stored in another memory that is separate from the second memory bank 404-2 and/or separate from any memory bank 404. This separate memory may or may not be part of, or proximate to, the ECC circuitry 112. Regardless of where or how the second ECC value 408-2 is stored, the control circuitry 210 (e.g., the ECC circuitry 112 or the array control logic 214) may write the second data 406-2 to the second memory bank 404-2 for a write operation, or it may read the second data 406-2 from the second memory bank 404-2 for a read operation.

Thus, example implementations for shared ECC circuitry can also pertain to memory read operations. For a couple of read operations, the memory device 110 can read third data from the first memory bank 404-1 and can determine, via the ECC engine 402, a third ECC value based on the third data. The memory device 110 can further read fourth data from the second memory bank 404-2 and can determine, via the ECC engine 402, a fourth ECC value based on the fourth data.

With a read operation, an error may be detected in the bits of the retrieved data. To check one or more data bits to detect an error, the memory device 110 may obtain a stored ECC value 408-8 from the first memory bank 404-1, with the stored ECC value 408-8 associated with the third data. The memory device 110 may also detect at least one error in the third data that is read from the first memory bank 404-1 based on the stored ECC value 408-8 and the third ECC value (e.g., the ECC value 408-9), such as if the values do not match. With a read operation, data accuracy or integrity may instead be verified. To do so, the memory device 110 may obtain a stored ECC value 408-8 from the second memory bank 404-2, with the stored ECC value 408-8 associated with the fourth data. The memory device 110 may also verify the fourth data that is read from the second memory bank 404-2 based on the stored ECC value 408-8 and the fourth ECC value (e.g., the ECC value 408-9), such as if the values do match. The memory device 110 may further signal that the fourth data is correct based on the verifying. The signaling may entail, for example, forwarding the fourth data to an interface 218 that is coupled to an interconnect 106 or indicating that the fourth data may be coupled to the interface 218.

For the flow chart(s) and flow diagram(s) described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 9, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Examples of multiple implementations are described below.

Example 1: A memory device comprising: at least one memory array comprising multiple memory banks; and error correction code (ECC) circuitry coupled to the multiple memory banks, the ECC circuitry comprising an ECC engine configured to: provide ECC determinations for two or more memory banks of the multiple memory banks.

Example 2: The memory device of example 1, wherein the ECC engine comprises a multibit ECC engine.

Example 3: The memory device of example 1 or example 2, wherein the multibit ECC engine comprises an N-bit ECC engine in which "N" is greater than two (2).

Example 4: The memory device of any one of the preceding examples, wherein the ECC engine is configured to provide ECC determinations for the two or more memory banks of the multiple memory banks for read operations and for write operations.

Example 5: The memory device of any one of the preceding examples, further comprising: an interface coupled to the at least one memory array, wherein the ECC circuitry is coupled between the interface and the two or more memory banks.

Example 6: The memory device of any one of the preceding examples, wherein the ECC circuitry is disposed between the interface and the two or more memory banks.

Example 7: The memory device of any one of the preceding examples, further comprising: one or more dies, wherein: a single die of the one or more dies comprises the at least one memory array and the ECC circuitry; the ECC circuitry is coupled to all memory banks of the multiple memory banks of the single die; and the ECC engine is configured to provide ECC determinations for all the memory banks of the multiple memory banks of the single die.

Example 8: The memory device of any one of the preceding examples, wherein: the single die comprises an interface configured to be coupled to an interconnect that is external to the single die, the interface coupled to the at least one memory array; and the ECC circuitry is coupled between the interface and all the memory banks of the multiple memory banks of the single die.

Example 9: The memory device of any one of the preceding examples, wherein the memory device comprises low-power double data rate (LPDDR) synchronous dynamic random-access memory (SDRAM).

Example 10: The memory device of any one of the preceding examples, wherein the memory device comprises a memory architecture that is configured to preclude use of a masked-write command.

Example 11: The memory device of any one of the preceding examples, wherein the masked-write command corresponds to an internal read-modify-write operation.

Example 12: The memory device of any one of the preceding examples, wherein the memory architecture is configured to selectively enable or disable a masked-write functionality.

Example 13: The memory device of any one of the preceding examples, further comprising: control circuitry configured to enable the masked-write functionality based on a command to enable the masked-write functionality.

Example 14: The memory device of any one of the preceding examples, wherein: the control circuitry is configured to disable the masked-write functionality based on another command to disable the masked-write functionality that precludes use of the masked-write command.

Example 15: The memory device of any one of the preceding examples, wherein: the multiple memory banks comprise four or more memory banks; and the ECC engine is configured to provide ECC determinations for the four or more memory banks of the multiple memory banks.

Example 16: The memory device of any one of the preceding examples, further comprising: multiple data paths, wherein the ECC circuitry is respectively coupled to the two or more memory banks of the multiple memory banks via two or more data paths of the multiple data paths.

Example 17: The memory device of any one of the preceding examples, wherein: the ECC engine is configured to provide at least one ECC value for the two or more memory banks of the multiple memory banks.

Example 18: The memory device of any one of the preceding examples, wherein the memory device comprises a die.

Example 19: The memory device of any one of the preceding examples, wherein the memory device comprises a memory module including multiple dies.

Example 20: A method comprising: determining, by an error correction code (ECC) engine, a first ECC value based on first data; writing the first ECC value to a first memory bank; determining, by the ECC engine, a second ECC value based on second data; and writing the second ECC value to a second memory bank.

Example 21: The method of example 20, wherein: the ECC engine comprises a multibit ECC engine; and the method further comprises: determining the first ECC value using the multibit ECC engine; and determining the second ECC value using the multibit ECC engine.

Example 22: The method of example 20 or example 21, further comprising: writing the first data in the first memory bank; and writing the second data in the second memory bank.

Example 23: The method of any one of examples 20-22, further comprising: receiving the first data from an interface for a die of a memory device; and receiving the second data from the interface for the die of the memory device.

Example 24: The method of any one of examples 20-23, further comprising: reading third data from the first memory bank; determining, by the ECC engine, a third ECC value based on the third data; reading fourth data from the second memory bank; and determining, by the ECC engine, a fourth ECC value based on the fourth data.

Example 25: The method of any one of examples 20-24, further comprising: obtaining a stored ECC value from the first memory bank, the stored ECC value associated with the third data; and detecting at least one error in the third data that is read from the first memory bank based on the stored ECC value and the third ECC value.

Example 26: The method of any one of examples 20-25, further comprising: obtaining a stored ECC value from the second memory bank, the stored ECC value associated with the fourth data; verifying the fourth data that is read from the second memory bank based on the stored ECC value and the fourth ECC value; and signaling the fourth data is correct based on the verifying.

Example 27: The method of any one of examples 20-26, further comprising: determining, by the ECC engine, a third ECC value based on third data; writing the third ECC value to a third memory bank; determining, by the ECC engine, a fourth ECC value based on fourth data; and writing the fourth ECC value to a fourth memory bank.

Example 28: The method of any one of examples 20-27, further comprising: writing the first ECC value to the first memory bank via a first data path disposed on a die; and writing the second ECC value to the second memory bank via a second data path disposed on the die.

Example 29: The method of any one of examples 20-28, further comprising: performing the determining of the first ECC value and the determining of the second ECC value in a memory architecture that precludes use of a masked-write command.

Example 30: The method of any one of examples 20-29, further comprising: receiving a command to enable masked-write functionality for multiple memory banks that comprise the first memory bank and the second memory bank; and enabling the masked-write functionality for the multiple memory banks responsive to the receiving of the command.

Example 31: The method of any one of examples 20-30, further comprising: receiving another command to disable the masked-write functionality for the multiple memory banks; and disabling the masked-write functionality for the multiple memory banks responsive to the receiving of the other command.

Example 32: An apparatus comprising: a first memory bank; a second memory bank; error correction code (ECC) circuitry; a first data path coupled between the first memory bank and the ECC circuitry; and a second data path coupled between the second memory bank and the ECC circuitry.

Example 33: The apparatus of example 32, wherein the ECC circuitry is configured to perform ECC processing on first data stored in the first memory bank and on second data stored in the second memory bank.

Example 34: The apparatus of example 32 or example 33, wherein the ECC circuitry is configured to: receive the first data from the first memory bank via the first data path; determine a first ECC value based on the first data; receive the second data from the second memory bank via the second data path; and determine a second ECC value based on the second data.

Example 35: The apparatus of any one of examples 32-34, further comprising: control circuitry that includes the ECC circuitry and that is coupled to the first data path and the second data path, wherein: the ECC circuitry is configured to: determine a first ECC value based on the first data; and determine a second ECC value based on the second data; and the control circuitry is configured to: transmit the first data to the first memory bank via the first data path; and transmit the second data to the second memory bank via the second data path.

Example 36: A memory comprising: multiple memory banks; and error correction code (ECC) logic coupled to the multiple memory banks, the ECC logic configured to provide ECC processing for each memory bank of the multiple memory banks.

Example 37: The memory of example 36, wherein the memory comprises a single die.

Example 38: The memory of example 36 or example 37, wherein the memory comprises low-power double data rate (LPDDR) synchronous dynamic random-access memory (SDRAM).

Example 39: The memory of any one of examples 36-38, wherein the memory comprises an architecture that is configured to omit a masked-write command.

Example 40: The memory of any one of examples 36-39, wherein an architecture of the memory is configured to omit an internal read-modify-write operation.

Example 41: The memory of any one of examples 36-40, wherein the ECC logic is configured to provide at least one ECC value to each memory bank of the multiple memory banks.

Example 42: The memory of any one of examples 36-41, wherein the multiple memory banks comprise at least four memory banks.

Example 43: The memory of any one of examples 36-42, further comprising: multiple sets of wires, each respective set of wires coupled between a respective memory bank of the multiple memory banks and the ECC logic.

Example 44: A method comprising: operating a package comprising one or more memory dies in an architecture in which at least one of a masked-write command or an internal read-modify-write operation is precluded, a memory die of the one or more memory dies comprising multiple memory banks; and providing an error correction code (ECC) value via ECC logic, the ECC logic shared between two or more of the multiple memory banks.

Example 45: The method of example 44, wherein the memory die comprises low-power dynamic random-access memory (DRAM).

Example 46: The method of example 44 or example 45, wherein the multiple memory banks comprise at least three memory banks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Conclusion

Although implementations for shared ECC circuitry have been described in language specific to certain features and/or methods, the subject of the appended claims is not necessarily limited to the specific features or methods described. Rather, the specific features and methods are disclosed as example implementations for shared ECC circuitry.

What is claimed is:

1. A memory device comprising:
   at least one memory array comprising multiple memory banks;
   error correction code (ECC) circuitry coupled to the multiple memory banks, the ECC circuitry comprising an ECC engine configured to:
     provide ECC determinations for two or more memory banks of the multiple memory banks for read operations and write operations; and
   an interface coupled to the at least one memory array, the ECC circuitry coupled between the interface and the two or more memory banks.

2. The memory device of claim 1, wherein the ECC engine comprises a multibit ECC engine.

3. The memory device of claim 2, wherein the multibit ECC engine comprises an N-bit ECC engine in which "N" is greater than two (2).

4. The memory device of claim 1, wherein the ECC circuitry is disposed between the interface and the two or more memory banks.

5. The memory device of claim 1, further comprising:
   one or more dies, wherein:
     a single die of the one or more dies comprises the at least one memory array, the ECC circuitry, and the interface;
     the ECC circuitry is coupled to all memory banks of the multiple memory banks of the single die; and
     the ECC engine is configured to provide ECC determinations for all the memory banks of the multiple memory banks of the single die.

6. The memory device of claim 5, wherein:
   the interface of the single die is configured to be coupled to an interconnect that is external to the single die; and
   the ECC circuitry is coupled between the interface and all the memory banks of the multiple memory banks of the single die.

7. The memory device of claim 1, wherein the memory device comprises low-power double data rate (LPDDR) synchronous dynamic random-access memory (SDRAM).

8. The memory device of claim 1, wherein the memory device comprises a memory architecture that is configured to preclude use of a masked-write command.

9. The memory device of claim 8, wherein the masked-write command corresponds to an internal read-modify-write operation.

10. The memory device of claim 8, wherein the memory architecture is configured to selectively enable or disable a masked-write functionality.

11. The memory device of claim 10, further comprising:
control circuitry configured to enable the masked-write functionality based on a command to enable the masked-write functionality.
12. The memory device of claim 11, wherein:
the control circuitry is configured to disable the masked-write functionality based on another command to disable the masked-write functionality that precludes use of the masked-write command.
13. The memory device of claim 1, wherein:
the multiple memory banks comprise four or more memory banks; and
the ECC engine is configured to provide ECC determinations for the four or more memory banks of the multiple memory banks.
14. The memory device of claim 1, further comprising:
multiple data paths,
wherein the ECC circuitry is respectively coupled to the two or more memory banks of the multiple memory banks via two or more data paths of the multiple data paths.
15. The memory device of claim 1, wherein:
the ECC engine is configured to provide at least one ECC value for the two or more memory banks of the multiple memory banks.
16. The memory device of claim 1, wherein the memory device comprises a die.
17. The memory device of claim 1, wherein the memory device comprises a memory module including multiple dies.
18. A method comprising:
determining, by an error correction code (ECC) engine, a first ECC value based on first data;
writing the first ECC value to a first memory bank;
determining, by the ECC engine, a second ECC value based on second data;
writing the second ECC value to a second memory bank;
reading third data from the first memory bank;
determining, by the ECC engine, a third ECC value based on the third data;
reading fourth data from the second memory bank; and
determining, by the ECC engine, a fourth ECC value based on the fourth data.
19. The method of claim 18, wherein:
the ECC engine comprises a multibit ECC engine; and
the method further comprises:
determining the first ECC value using the multibit ECC engine; and
determining the second ECC value using the multibit ECC engine.
20. The method of claim 18, further comprising:
writing the first data in the first memory bank; and
writing the second data in the second memory bank.
21. The method of claim 20, further comprising:
receiving the first data from an interface for a die of a memory device; and
receiving the second data from the interface for the die of the memory device.
22. The method of claim 18, further comprising:
obtaining a stored ECC value from the first memory bank, the stored ECC value associated with the third data; and
detecting at least one error in the third data that is read from the first memory bank based on the stored ECC value and the third ECC value.
23. The method of claim 18, further comprising:
obtaining a stored ECC value from the second memory bank, the stored ECC value associated with the fourth data;
verifying the fourth data that is read from the second memory bank based on the stored ECC value and the fourth ECC value; and
signaling the fourth data is correct based on the verifying.
24. The method of claim 18, further comprising:
determining, by the ECC engine, a fifth ECC value based on fifth data;
writing the fifth ECC value to a third memory bank;
determining, by the ECC engine, a sixth ECC value based on sixth data; and
writing the sixth ECC value to a fourth memory bank.
25. The method of claim 18, further comprising:
writing the first ECC value to the first memory bank via a first data path disposed on a die; and
writing the second ECC value to the second memory bank via a second data path disposed on the die.
26. The method of claim 18, further comprising:
performing the determining of the first ECC value and the determining of the second ECC value in a memory architecture that precludes use of a masked-write command.
27. The method of claim 26, further comprising:
receiving a command to enable masked-write functionality for multiple memory banks that comprise the first memory bank and the second memory bank; and
enabling the masked-write functionality for the multiple memory banks responsive to the receiving of the command.
28. The method of claim 27, further comprising:
receiving another command to disable the masked-write functionality for the multiple memory banks; and
disabling the masked-write functionality for the multiple memory banks responsive to the receiving of the other command.
29. An apparatus comprising:
an interface;
a first memory bank coupled to the interface;
a second memory bank coupled to the interface;
error correction code (ECC) circuitry coupled between the interface and the first and second memory banks, the ECC circuitry configured to:
provide ECC determinations for the first and second memory banks for read operations and write operations;
a first data path coupled between the first memory bank and the ECC circuitry; and
a second data path coupled between the second memory bank and the ECC circuitry.
30. The apparatus of claim 29, wherein the ECC circuitry is configured to perform ECC processing on first data stored in the first memory bank and on second data stored in the second memory bank.
31. The apparatus of claim 30, wherein the ECC circuitry is configured to:
receive the first data from the first memory bank via the first data path;
determine a first ECC value based on the first data;
receive the second data from the second memory bank via the second data path; and
determine a second ECC value based on the second data.
32. The apparatus of claim 30, further comprising:
control circuitry that includes the ECC circuitry and that is coupled to the first data path and the second data path, wherein:
the ECC circuitry is configured to:
determine a first ECC value based on the first data; and determine a second ECC value based on the second data; and the control circuitry is configured to:
- transmit the first data to the first memory bank via the first data path; and
- transmit the second data to the second memory bank via the second data path.

33. A memory comprising:

a single die comprising:
- multiple memory banks;
- an interface coupled to the multiple memory banks, the interface configured to be coupled to an interconnect that is external to the single die; and
- error correction code (ECC) logic coupled between the interface and the multiple memory banks, the ECC logic configured to provide ECC processing for each memory bank of the multiple memory banks for read operations and write operations.

34. The memory of claim 33, wherein the memory comprises low-power double data rate (LPDDR) synchronous dynamic random-access memory (SDRAM).

35. The memory of claim 33, wherein the memory comprises an architecture that is configured to omit a masked-write command.

36. The memory of claim 33, wherein an architecture of the memory is configured to omit an internal read-modify-write operation.

37. The memory of claim 33, wherein the ECC logic is configured to provide at least one ECC value to each memory bank of the multiple memory banks.

38. The memory of claim 33, wherein the multiple memory banks comprise at least four memory banks.

39. The memory of claim 33, further comprising:
- multiple sets of wires, each respective set of wires coupled between a respective memory bank of the multiple memory banks and the ECC logic.

* * * * *